US012371617B2

(12) United States Patent
Min et al.

(10) Patent No.: US 12,371,617 B2
(45) Date of Patent: *Jul. 29, 2025

(54) QUANTUM DOTS, QUANTUM DOT-POLYMER COMPOSITE, AND ELECTRONIC DEVICE INCLUDING THE SAME

(71) Applicant: SAMSUNG ELECTRONICS CO., LTD., Suwon-si (KR)

(72) Inventors: Jihyun Min, Seoul (KR); Eun Joo Jang, Suwon-si (KR); Yong Wook Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/224,167

(22) Filed: Jul. 20, 2023

(65) Prior Publication Data

US 2023/0374378 A1  Nov. 23, 2023

Related U.S. Application Data

(63) Continuation of application No. 17/383,814, filed on Jul. 23, 2021, now Pat. No. 11,753,589.

(30) Foreign Application Priority Data

Jul. 23, 2020  (KR) ........................ 10-2020-0091655

(51) Int. Cl.
| | | |
|---|---|---|
| *C09K 11/88* | (2006.01) | |
| *B82Y 20/00* | (2011.01) | |
| *B82Y 30/00* | (2011.01) | |
| *C01G 9/00* | (2006.01) | |
| *C01G 15/00* | (2006.01) | |
| *C09K 11/02* | (2006.01) | |
| *C09K 11/56* | (2006.01) | |
| *C09K 11/62* | (2006.01) | |
| *C09K 11/70* | (2006.01) | |
| *H10K 50/115* | (2023.01) | |

(52) U.S. Cl.
CPC ............ *C09K 11/883* (2013.01); *C01G 9/006* (2013.01); *C01G 15/00* (2013.01); *C09K 11/025* (2013.01); *C09K 11/565* (2013.01); *C09K 11/621* (2013.01); *C09K 11/703* (2013.01); *B82Y 20/00* (2013.01); *B82Y 30/00* (2013.01); *C01P 2004/04* (2013.01); *C01P 2004/64* (2013.01); *C01P 2006/60* (2013.01); *H10K 50/115* (2023.02)

(58) Field of Classification Search
CPC ... C09K 11/883; C09K 11/025; C09K 11/565; C09K 11/621; C09K 11/703; H10K 50/115
See application file for complete search history.

(56) References Cited

U.S. PATENT DOCUMENTS

| | | |
|---|---|---|
| 7,621,997 B2 | 11/2009 | Jun et al. |
| 7,964,278 B2 | 6/2011 | Banin et al. |
| 8,343,576 B2 | 1/2013 | Banin et al. |
| 9,138,711 B2 | 9/2015 | Treadway et al. |
| 10,170,648 B2 | 1/2019 | Jun et al. |
| 10,950,741 B2 | 3/2021 | Jun et al. |
| 11,661,526 B2 | 5/2023 | Pousthomis et al. |
| 11,702,593 B2 | 7/2023 | Min et al. |
| 11,753,589 B2 * | 9/2023 | Min ..................... C09K 11/621 |
| | | 252/301.6 S |
| 2009/0230382 A1 | 9/2009 | Banin et al. |
| 2015/0218444 A1 | 8/2015 | Kang et al. |
| 2017/0059988 A1 | 3/2017 | Paek et al. |
| 2018/0327665 A1 | 11/2018 | Lee et al. |
| 2019/0002719 A1 | 1/2019 | Pousthomis et al. |
| 2019/0002759 A1 | 1/2019 | D'Amico et al. |
| 2019/0040313 A1 | 2/2019 | Pousthomis et al. |
| 2020/0131435 A1 | 4/2020 | Pousthomis et al. |
| 2021/0167228 A1 | 6/2021 | Jun et al. |
| 2021/0269715 A1 | 9/2021 | Min et al. |
| 2023/0303924 A1 | 9/2023 | Min et al. |

FOREIGN PATENT DOCUMENTS

| | | | |
|---|---|---|---|
| CN | 108441221 A | 8/2018 | |
| CN | 108929691 A | 12/2018 | |
| CN | 110997569 A | 4/2020 | |
| KR | 101159853 B1 | 6/2012 | |
| KR | 101374512 B1 | 3/2014 | |
| KR | 20140056500 A | 5/2014 | |
| KR | 101563878 B1 | 10/2015 | |
| KR | 101586875 B1 | 1/2016 | |
| KR | 101797366 B1 | 11/2017 | |
| KR | 20180124765 A | 11/2018 | |
| KR | 20190068242 A | 6/2019 | |

(Continued)

OTHER PUBLICATIONS

Extended European Search Report dated Nov. 16, 2021, of the corresponding European Patent Application No. 21187508.3.

(Continued)

*Primary Examiner* — C Melissa Koslow

(74) *Attorney, Agent, or Firm* — CANTOR COLBURN LLP

(57) ABSTRACT

A quantum dot, a quantum dot-polymer composite, and an electronic device including the same. The quantum dot includes a core including a first semiconductor nanocrystal; a first shell including a second semiconductor nanocrystal including a Group III-VI compound on the core; and a second shell including a third semiconductor nanocrystal having a composition different from that of the second semiconductor nanocrystal on the first shell; wherein one of the first semiconductor nanocrystal and the third semiconductor nanocrystal includes a Group III-V compound.

40 Claims, 11 Drawing Sheets

(56) References Cited

FOREIGN PATENT DOCUMENTS

| WO | 2018220160 A1 | 12/2018 |
| WO | 2018220163 A1 | 12/2018 |
| WO | 2018220165 A1 | 12/2018 |
| WO | 2018220167 A1 | 12/2018 |

OTHER PUBLICATIONS

Sungwoo Kim et al., "Highly Luminescent InP/GaP/ZnS Nanocrystals and Their Application to White Light-Emitting Diodes," Journal of the American Chemical Society, Feb. 3, 2012, pp. 3804-3809, vol. 134.

Taro Uematsu et al., "Narrow band-edge photoluminescence rom AgInS2 semiconductor nanoparticles by the formation of amorphous III-VI semiconductor shells," NPG Asia Materials, Aug. 7, 2018, pp. 1-14.

Office Action dated Aug. 17, 2024, of the corresponding Chinese Patent Application No. 202110839147.X.

Changhyun Jin et al., "Influence of ZnO coating and annealing on the photoluminescence properties of larva-like gallium sulfide nanostructures," Current Applied Physics, Jan. 20, 2013, pp. S127-S130, vol. 13.

Extended European Search Report dated Nov. 16, 2021, issued in EP patent Application No. 21187508.3 of technically related U.S. Appl. No. 18/224,167.

M. Mosaferi et al., "Direct band gap in gallium sulfide nanostructures," Materials Science, Oct. 27, 2018, pp. 1-8.

Peter M. Ndangili et al., "Gallium-Induced Perturbation of Zinc Selenide Quantum Dots Electronics," Materials Science inc. Nanomaterials & Polymers, 2017, pp. 7054-7062, vol. 2.

Shuming Yang et al., "The synthesis and optical properties of GaSe/InSe core/shell nanoparticles," Journal of Photochemistry and Photobiology A: Chemistry, May 18, 2007, pp. 159-165, vol. 192.

Taro Uematsu et al., "Narrow band-edge photoluminescence from AgInS2 semiconductor nanoparticles by the formation of amorphous III-VI semiconductor shells," NPG Asia Materials, 2018, pp. 713-726, vol. 10.

* cited by examiner

QUANTUM DOTS, QUANTUM DOT-POLYMER COMPOSITE, AND ELECTRONIC DEVICE INCLUDING THE SAME

CROSS-REFERENCE TO RELATED APPLICATIONS

This application is a continuation application of application Ser. No. 17/383,814, filed Jul. 23, 2021, now U.S. Pat. No. 11,753,589, which claims priority to and the benefit of Korean Patent Application No. 10-2020-0091655 filed in the Korean Intellectual Property Office on Jul. 23, 2020, and all the benefits accruing therefrom under 35 U.S.C. § 119, the contents of which in their entirety are herein incorporated by reference.

BACKGROUND

1. Field

Quantum dots, quantum dot-polymer composites, and electronic devices are disclosed.

2. Description of the Related Art

Physical characteristics (e.g., bandgap energies, melting points, etc.) of nanoparticles that are intrinsic characteristics may be controlled by changing particle sizes of the nanoparticles, unlike bulk materials. For example, semiconductor nanocrystal particles also referred to as quantum dots are a crystalline material having a size of several nanometers. Such semiconductor nanocrystal particles have such a small size that they have a large surface area per unit volume and exhibit quantum confinement effects, and thus have different properties from the characteristics of bulk materials having the same composition. Quantum dots may absorb light from an excitation source to be excited, and may emit energy corresponding to bandgap energies on the quantum dots.

SUMMARY

An embodiment provides quantum dots capable of implementing improved optical properties (e.g., luminous efficiency and full width at half maximum (FWHM)).

An embodiment provides a quantum dot-polymer composite including the aforementioned quantum dots.

An embodiment provides an electronic device including the aforementioned quantum dots or quantum dot-polymer composites.

A quantum dot according to an embodiment includes a core including a first semiconductor nanocrystal; a first shell including a second semiconductor nanocrystal including a Group III-VI compound on the core; and a second shell including a third semiconductor nanocrystal having a composition different from that of the second semiconductor nanocrystal on the first shell, wherein one of the first semiconductor nanocrystal and the third semiconductor nanocrystal includes a Group III-V compound.

One of the first semiconductor nanocrystal and the third semiconductor nanocrystal may include a Group III-V compound, and the other may include a Group II-VI compound.

The first semiconductor nanocrystal may include a Group III-V compound, the third semiconductor nanocrystal may include a Group II-VI compound, and a ratio (m2:m3) of an effective mass (m2) of the second semiconductor nanocrystal relative to an effective mass (m3) of the third semiconductor nanocrystal may be about 0.4:1 to about 2.5:1.

The second semiconductor nanocrystal may have an electron effective mass of less than about 0.39 $m_e$, for example, less than or equal to about 0.34 $m_e$.

The first semiconductor nanocrystal may include a Group III-V compound and the third semiconductor nanocrystal may include a Group II-VI compound, wherein a difference ($m_{e2}$-$m_{e3}$) between an electron effective mass ($m_{e2}$) of the second semiconductor nanocrystal and an electron effective mass ($m_{e3}$) of the third semiconductor nanocrystal may be less than or equal to about 0.2 $m_e$, and a difference ($m_{h2}$-$m_{h3}$) between a hole effective mass ($m_{h2}$) of the second semiconductor nanocrystal and a hole effective mass ($m_{h3}$) of the third semiconductor nanocrystal may be less than or equal to about 1.5 $m_e$.

The Group III-V compound of the first semiconductor nanocrystal may further include a Group II element. The Group III-V compound of the first semiconductor nanocrystal may include InP, GaP, InAs, GaAs, InSb, GaSb, InGaP, InAsP, InSbP, InGaAs, InZnP, GaZnP, InZnAs, or a combination thereof.

The second semiconductor nanocrystal may include gallium (Ga), for example, a gallium chalcogenide.

The second semiconductor nanocrystal may include a compound represented by $(M^1)_2(X^1)_3$ (wherein $M^1$ is In, Ga, or a combination thereof, and $X^1$ is S, Se, Te, or a combination thereof), a compound represented by Chemical Formula 1, or a combination thereof:

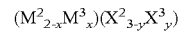    [Chemical Formula 1]

In Chemical Formula 1,
$M^2$ and $M^3$ are each independently In, Ga, or a combination thereof, $X^2$ and $X^3$ are each independently S, Se, Te, or a combination thereof, x is 0 to 2, and y is 0 to 3.

The Group II-VI compound may include a zinc chalcogenide, and for example, may include ZnSe, ZnTeSe, ZnSeS, ZnTeS, ZnS, or a combination thereof. The Group II-VI compound may include zinc, sulfur, and selenium or zinc, selenium, and tellurium.

In the quantum dot, a mole ratio of a Group III element of the Group III-V compound to a Group V element of the Group III-V compound may be in the range of about 1:1 to about 50:1, for example, about 2.5:1 to about 20:1.

In the quantum dot, a mole ratio of a Group III element of the Group III-V compound to a Group II element of the Group II-VI compound may be greater than about 0:1 and less than or equal to about 5:1, for example, in the range of about 0.05:1 to about 2:1.

In the quantum dot, a mole ratio of a Group III element of the Group III-V compound to a Group VI element of the Group II-VI compound may be greater than about 0:1 and less than or equal to about 5:1, for example, from about 0.05:1 to about 2:1.

In the quantum dot, the first semiconductor nanocrystal may include indium (In), the second semiconductor nanocrystal may include gallium (Ga), and a mole ratio (Ga:In) of gallium to indium may be about 0.05:1 to about 4.5:1.

The second shell may include a Group II-VI compound, a Group III-V compound, or a combination thereof.

The second shell may include a plurality of layers, and the plurality of layers may include different Group II-VI compounds.

A layer closest to the core among the plurality of layers may include Se. A layer disposed farthest from the core among the plurality of layers may include S.

A bandgap energy of the second semiconductor nanocrystal may be greater than a bandgap energy of the first semiconductor nanocrystal, and the bandgap energy of the second semiconductor nanocrystal may be greater than a bandgap energy of the third semiconductor nanocrystal.

The second shell may include a plurality of layers, and a third semiconductor nanocrystal present in a layer closest to the first shell among the plurality of layers may have a smaller bandgap energy than the second semiconductor nanocrystal of the first shell.

A lattice mismatch of the first semiconductor nanocrystal and the second semiconductor nanocrystal may be less than or equal to about 15%.

The maximum emission peak of the quantum dots may have a full width at half maximum (FWHM) of less than or equal to about 40 nanometers (nm), and the quantum dots may have a quantum efficiency of greater than or equal to about 55%.

According to an embodiment, a quantum dot-polymer composite including the aforementioned quantum dots is provided. The quantum dot-polymer composite may include a polymer matrix; and the aforementioned quantum dots dispersed in the polymer matrix.

The polymer matrix may include a thiolene polymer, a (meth)acrylate polymer, a urethane polymer, an epoxy polymer, a vinyl polymer, a silicone, or a combination thereof. The quantum dot-polymer composite may further include metal oxide particulates.

According to an embodiment, an electronic device includes a first electrode and a second electrode facing each other; and
an active layer between the first electrode and the second electrode;
wherein the active layer includes the aforementioned quantum dots.

According to an embodiment, an electronic device includes a light source and a light emitting element,
wherein the light emitting element includes the aforementioned quantum dots, and
the light source is configured to provide incident light to the light emitting element.

The incident light may have a photoluminescence peak wavelength of about 400 nm to about 500 nm.

The electronic device may be an electroluminescent device, an organic light emitting diode (OLED), a sensor, an imaging sensor, a solar cell, or a liquid crystal display (LCD) device.

In an embodiment, a quantum dot includes a core including a first semiconductor nanocrystal including indium and phosphorus; a first shell including a second semiconductor nanocrystal including gallium and sulfur; and a second shell including a third semiconductor nanocrystal including zinc and sulfur.

The quantum dots may exhibit improved light emitting properties (e.g., improved excitation light absorption rate and reduced full width at half maximum (FWHM)). The quantum dots may be utilized in various display devices and biological labeling (e.g., biosensors or bioimaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
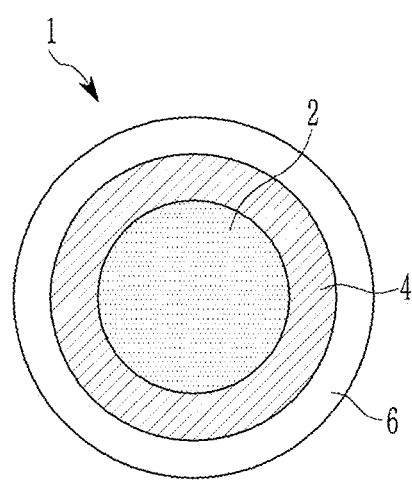
FIG. 1 is a schematic view showing a cross-sectional structure of a quantum dot according to an embodiment.

This disclosure will be described more fully hereinafter in the following detailed description, in which some but not all embodiments of this disclosure are described with reference to the attached drawings. This disclosure may be embodied in many different forms and is not be construed as limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise", and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein a, e.g., at least one, hydrogen atom thereof is replaced by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(═NH)NH$_2$), a hydrazino group (—NHNH$_2$), a hydrazono group (═N(NH$_2$)), an aldehyde group (—C(═O)H), a carbamoyl group (—C(O)NH$_2$), a thiol group (—SH), an ester group (—C(═O)OR, wherein R is a C1 to C6 alkyl group or a C6 to C12 aryl group), a carboxyl group (—COOH) or a salt thereof (—C(═O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a "hydrocarbon group" refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an arene (e.g., a phenyl or naphthyl group).

As used herein, when a definition is not otherwise provided, "hetero" refers to one including 1 to 3 heteroatoms of N, O, S, Si, P, or a combination thereof.

As used herein, when a definition is not otherwise provided, "dispersion" refers to dispersion wherein a dispersed phase is a solid and a continuous phase includes a liquid. For example, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., less than or equal to about 2 μm, or less than or equal to about 1 μm).

As used herein, when a definition is not otherwise provided, "Group" refers to a group of Periodic Table.

As used herein, when a definition is not otherwise provided, "Group II" refers to a Group IIA and a Group IIB, and examples of Group II may include Zn, Hg, and Mg, but are not limited thereto.

As used herein, when a definition is not otherwise provided, "Group III" may include a Group IIIA and a Group IIIB, and examples of Group III metals include Al, In, Ga, and TI, but are not limited thereto.

As used herein, when a definition is not otherwise provided, "Group V" includes Group VA and includes nitrogen, phosphorus, arsenic, antimony, and bismuth, but is not limited thereto.

As used herein, when a definition is not otherwise provided, "Group VI" includes Group VIA and includes sulfur, selenium, and tellurium, but is not limited thereto.

Semiconductor nanocrystal particles also known as a (e.g., colloidal) quantum dots are a crystalline material having a size of several nanometers and may have a large surface area per a unit volume and may exhibit a quantum confinement effect. A quantum dot may absorb light from an excitation source to be excited, and may emit energy corresponding to a bandgap energy of the quantum dot.

Quantum dots have a potential applicability to, e.g., may be useful in, various electronic devices due to unique photoluminescence characteristics. Quantum dots having properties applicable to, e.g., useful in, electronic devices and the like are mostly cadmium-based, i.e., cadmium-containing, quantum dots. However, cadmium causes a serious environment/health problem and thus is one of restricted elements. A cadmium-free quantum dot (hereinafter, also referred to as a non-cadmium quantum dot) may be for example a Group III-V-based (i.e., a Group III-V-containing) nanocrystal. The cadmium-free quantum dot has insufficient luminescence properties (e.g., blue light absorption rate) and stability compared to those of a cadmium-based quantum dot. Blue light (e.g., having wavelength of less than or equal to about 460 nm) may be used as an energy excitation source of the quantum dot. The cadmium-based quantum dots have high absorption intensity for blue light but in the case of non-cadmium-based quantum dots, an absorption intensity at blue light is not high, which may lead to a reduced luminance in a display device.

Since polarized light passed through a liquid crystal expresses a color while passing an absorption type color filter, a liquid crystal display (hereinafter, LCD) may have problems in that luminance is deteriorated due to a narrow viewing angle and a low light transmittance of the absorption type color filter. A photoluminescent type color filter may be used to overcome the technical limits of the display device including the absorption type color filter. A quantum dot-based color filter uses blue light instead of white light as an excitation light, and a color filter is disposed in front of the device to convert the excitation light to the desirable light (e.g., green light/red light). Therefore, a quantum dot-based color filter may solve the technical problems of, for example, the liquid crystal display (e.g., narrow viewing angle and considerable light loss). The light with linearity may be scattered in all directions while passing through the liquid crystal layer, thus solving a viewing angle problem and avoiding an optical loss caused by the absorption type color filter.

However, when employing a quantum dot-based color filter, the excitation light propagating in the forward direction of the device may become a serious technical problem and needs to be blocked. A cadmium-free quantum dot may not provide a high enough absorption rate to handle this problem. The introduction of light scatterers may be considered to improve an absorption rate. However, this may lead to an increase in manufacturing cost. A light scatterer has a high external light reflectance, which may lead to an increase in external light reflection and may provide additional difficulties in the process due to solid increase. In order to block the excitation light, a blue light filter may be used, which may cause the cost rise and the external light reflection increase, so causing the optical loss, contrast deterioration, and a sharpness reduction of the display device.

On the other hand, in order for a display using quantum dots to realize, e.g., exhibit, a high color reproducibility, quantum dots having a lower, e.g., smaller, full width at half maximum (FWHM) may be desired. However, quantum dots based on a Group III-V compounds including indium (In) and phosphorus (P) in the core have a smaller band gap and a larger Bohr radius than cadmium-based cores such as CdSe cores, so the change in FWHM according to the size of the core is large. In addition, since the core including indium and phosphorus is susceptible to surface oxidation, the FWHM of the core-shell quantum dots may be further increased compared with the core. Quantum dots based on Group III-V compound (e.g., InP) cores emit light of a desired wavelength (e.g., greater than about 470 nm, greater than or equal to about 475 nm, or greater than or equal to about 480 nm and less than or equal to about 580 nm) while emitting light at a reduced level of FWHM (e.g., less than or equal to about 40 nm, or less than or equal to about 35 nm) may be difficult to implement.

The quantum dot according to an embodiment may exhibit an increased excitation light absorption rate and a reduced full width at half maximum (FWHM) without including cadmium as it has a configuration to be described herein, which may solve the described problems.

A quantum dot (also referred to as quantum dots) according to an embodiment is described with reference to FIG. 1. FIG. 1 schematically shows a quantum dot cross-sectional structure according to an embodiment.

Referring to FIG. 1, a quantum dot 1 according to an embodiment includes a core 2 including a first semiconductor nanocrystal; a first shell 4 including a second semiconductor nanocrystal including a Group III-VI compound on the core 2; and a second shell 6 including a third semiconductor nanocrystal on the first shell 4, wherein one of the first semiconductor nanocrystal and the third semiconductor nanocrystal includes a Group III-V compound.

One of the first semiconductor nanocrystal and the third semiconductor nanocrystal may include a Group III-V compound, and the other may include a Group II-VI compound.

In an embodiment, the first semiconductor nanocrystal may include a Group III-V compound, and the third semiconductor nanocrystal may include a Group II-VI compound. In this case, the quantum efficiency of the quantum dot 1 may be controlled by adjusting a ratio (m2:m3) of the effective mass (m2) of the second semiconductor nanocrystal relative to an effective mass (m3) of the third semiconductor nanocrystal to a certain range.

The effective mass is the apparent mass of the charge carriers (electrons or holes) present in the crystal. In order to explain the behavior of the charge carriers in the crystal, there is a difficulty in considering the interactions with many atoms in the lattice. However, by introducing effective mass, the behavior of charge carriers may be predicted by maximizing the laws of physics applied to free electrons. The effective mass may be calculated as follows through Equation 1 between an E-k energy band of free electrons and a mass of electrons, and may also be measured by experiments such as cyclotron resonance.

$$m^* = \pm \hbar^2 \left( \frac{d^2 E_k}{dk^2} \right)^{-1}$$
Equation 1

In Equation 1,
m* is the effective mass, E is the kinetic energy, k is the wavevector, and $\hbar(=h/2\pi)$ is the reduced Planck constant.

The first semiconductor nanocrystal may include a Group III-V compound, and the third semiconductor nanocrystal includes a Group II-VI compound, wherein a ratio (m2:m3) of the (electron and/or hole) effective mass (m2) of the second semiconductor nanocrystal relative to an (electron and/or hole) effective mass (m3) of the third semiconductor nanocrystal may be in the range of greater than about 0.4:1 and less than or equal to about 2.5:1. If the effective mass (m2) of the second semiconductor nanocrystal included in the first shell and the effective mass (m3) of the third semiconductor nanocrystal included in the second shell are in a similar range to each other (that is, the ratio (m2:m3) of the effective masses is in the range of greater than about 0.4:1 and less than or equal to about 2.5:1), the quantum efficiency of the quantum dots may be improved.

The ratio (m2:m3) of the effective masses may be for example greater than or equal to about 0.5:1, greater than or equal to about 0.6:1, greater than or equal to about 0.7:1, or greater than or equal to about 0.8:1, greater than or equal to about 0.9:1, greater than or equal to about 1.0:1, and less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.3:1, or less than or equal to about 1.2:1.

A difference ($m_{e2}$-$m_{e3}$) between the electron effective mass ($m_{e2}$) of the second semiconductor nanocrystal and the electron effective mass ($m_{e3}$) of the third semiconductor nanocrystal may be less than or equal to about 0.2 $m_e$, less than or equal to about 0.15 $m_e$, less than or equal to about 0.1 $m_e$, or less than or equal to about 0.05 $m_e$. In addition, a difference ($m_{h2}-m_{h3}$) between the hole effective mass ($m_{h2}$) of the second semiconductor nanocrystal and the hole effective mass ($m_{h3}$) of the third semiconductor nanocrystal may be less than or equal to about 1.5 $m_e$, less than or equal to about 1.0 $m_e$, less than or equal to about 0.7 $m_e$, less than or equal to about 0.5 $m_e$, or less than or equal to about 0.3 $m_e$.

The second semiconductor nanocrystal may have an electron effective mass of less than about 0.39 $m_e$, less than or equal to about 0.34 $m_e$, less than or equal to about 0.30 $m_e$, less than or equal to about 0.25 $m_e$, or less than or equal to about 0.20 $m_e$. Also, the second semiconductor nanocrystal may have a hole effective mass of less than about 1.76 $m_e$, less than or equal to about 1.5 $m_e$, less than or equal to about 1.2 $m_e$, or less than or equal to about 0.9 $m_e$.

The Group III-V compound included in the first semiconductor nanocrystal of the core 2 and the third semiconductor nanocrystal included in the second shell 6 may include indium and phosphorus. The first semiconductor nanocrystal or the third semiconductor nanocrystal may further include a Group II element. The Group III-V compound may include InP, GaP, InAs, GaAs, InSb, GaSb, InGaP, InAsP, InSbP, InGaAs, InZnP, GaZnP, InZnAs, or a combination thereof.

The second semiconductor nanocrystal including the Group III-VI compound included in the first shell 4 may be controlled so that the quantum dot 1 may emit a desired wavelength of light and may improve the quantum efficiency of the quantum dot 1.

While not wishing to be bound by a specific theory, it is understood that the core 2 including the first semiconductor nanocrystal has defects on the surface during the shell formation process, making it difficult to form a uniform shell. As a result, the produced quantum dots 1 may have an increased number of traps on the surface, or a non-uniform shape or size distribution. However, the first shell 4 including a Group III-VI compound (e.g., a gallium chalcogenide) passivates the core 2 relatively uniformly, so that the electron-hole overlapping degree within the quantum dots 1 may increase, surface defects may be reduced, and the quantum dots 1 may have a uniform shape or size distribution.

The second semiconductor nanocrystal may include gallium (Ga). For example, the second semiconductor nanocrystal may include a gallium chalcogenide.

The second semiconductor nanocrystal may include a compound represented by $(M^1)_2(X^1)_3$ (wherein $M^1$ is In, Ga or a combination thereof, and $X^1$ is S, Se, Te, or a combination thereof), a compound represented by Chemical Formula 1, or a combination thereof:

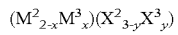   [Chemical Formula 1]

$$(M^2_{2-x}M^3_x)(X^2_{3-y}X^3_y)$$

In Chemical Formula 1,
$M^2$ and $M^3$ are each independently In, Ga, or a combination thereof, $X^2$ and $X^3$ are each independently S, Se, Te, or a combination thereof, x is 0 to 2, and y is 0 to 3.

Specific examples of the second semiconductor nanocrystal may include InS, $In_2S_3$, InSe, $In_2Se_3$, InTe, $In_2Te_3$, GaS, $Ga_2S_3$, GaSe, $Ga_2Se_3$, GaTe, $Ga_2Te_3$, $In_2Se_{3-y}Te_y$, $Ga_2Se_{3-y}Te_y$, $In_2S_{3-y}Se_y$, $Ga_2S_{3-y}Se_y$, and the like, and y ranges from 0 to 3, for example from 1 to 2.

The Group II-VI compound included in the first semiconductor nanocrystal of the core 2 and the third semiconductor nanocrystal included in the second shell 6 may include a zinc chalcogenide. The zinc chalcogenide may be a compound including zinc and a chalcogen element (e.g., selenium, tellurium, sulfur, or a combination thereof). For example, the zinc chalcogenide may include ZnSe, ZnTeSe, ZnSeS, ZnTeS, ZnS, or a combination thereof. The Group II-VI compound may include zinc, sulfur, and selenium or zinc, selenium, and tellurium. In an embodiment, the Group II-VI compound may include zinc and sulfur. The Group II-VI compound includes zinc and sulfur, and may further include selenium, tellurium, or a combination thereof.

The mole ratio of the Group III element to the Group V element in the quantum dot 1 may be in the range of about 1:1 to about 50:1. In an embodiment, the mole ratio of the Group III element to the Group V element may be greater than or equal to about 1:1, greater than or equal to about 2:1, greater than or equal to about 2.5:1, greater than or equal to about 3:1, or greater than or equal to about 4:1, and less than or equal to about 50:1, less than or equal to about 45:1, less than or equal to about 40:1, less than or equal to about 35:1, less than or equal to about 30, less than or equal to about 25:1, or less than or equal to about 20:1. If the mole ratio is within the disclosed ranges, the luminous efficiency and full width at half maximum (FWHM) of the quantum dot 1 may be controlled.

In the quantum dot 1, when the second semiconductor nanocrystal includes gallium (Ga), a mole ratio (Ga:In) of gallium to indium may be in the range of about 0.05:1 to about 4.5:1. In an embodiment, the mole ratio (Ga:In) of gallium to indium may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, or greater than or equal to about 0.4:1 and less than or equal to about 4.5:1, less than or equal to about 4.0:1, less than or equal to about 3.5:1, less than or equal to about 3.0:1, less than or equal to about 2.5:1, less than or equal to about 2.0:1, less than or equal to about 1.9:1, less than or equal to about 1.8:1, less than or equal to about 1.7:1, or less than or equal to about 1.6:1.

In addition, in the quantum dot 1, a mole ratio of the Group III element to the Group II element may be greater than about 0:1 and less than or equal to about 5:1, for example greater than or equal to about 0.01:1, greater than or equal to about 0.02:1, greater than or equal to about 0.03:1, greater than or equal to about 0.04:1, or greater than or equal to about 0.05:1 and less than or equal to about 5:1, less than or equal to about 4:1, less than or equal to about 3:1, or less than or equal to about 2:1. If the mole ratio is within the disclosed ranges, the luminous efficiency and full width at half maximum (FWHM) of the quantum dot 1 may be controlled.

In addition, in the quantum dot 1, a mole ratio of the Group III element to the Group VI element may be greater than about 0:1 and less than or equal to about 5:1, for example greater than or equal to about 0.01:1, greater than or equal to about 0.02:1, greater than or equal to about 0.03:1, greater than or equal to about 0.04:1, or greater than or equal to about 0.05:1 and less than or equal to about 5:1, less than or equal to about 4:1, less than or equal to about 3:1, or less than or equal to about 2:1. If the mole ratio is within the disclosed ranges, the luminous efficiency and full width at half maximum (FWHM) of the quantum dot 1 may be controlled.

The contents and mole ratios of each element in the quantum dot 1 described herein may be confirmed by a suitable analytical means (e.g., inductively coupled plasma atomic emission spectroscopy (ICP-AES), X-ray photoelectron spectroscopy (XPS), ion chromatography, TEM-EDS (transmission electron microscopy energy-dispersive X-ray spectroscopy, etc.).

The second shell 6 may include a third semiconductor nanocrystal of a Group II-VI compound, a Group III-V compound, or a combination thereof. The Group II-VI compound and the Group III-V compound are the same as described herein.

The second shell 6 may include a plurality of layers, and the plurality of layers may include different types of Group II-VI compounds. Among the plurality of layers, a layer relatively close to the core (i.e., a layer closest to the first shell) may include Se. Among the plurality of layers, a layer disposed relatively far from the core (i.e., a layer disposed farthest from the first shell) may include S. For example, the second shell 6 may include a first layer formed over the first shell 4 and a second layer formed thereon, wherein the first layer and the second layer may include different types of Group II-VI compounds. In an embodiment, the first layer may include zinc and selenium, and the second layer may include zinc and sulfur.

In an embodiment, a bandgap energy of the second semiconductor nanocrystal may be greater than a bandgap energy of the first semiconductor nanocrystal and a bandgap energy of the third semiconductor nanocrystal. In energy band alignment, a balance band edge and a conduction band edge of the first semiconductor nanocrystal may be within a bandgap energy of the second semiconductor nanocrystal. A balance band edge and a conduction band edge of the third semiconductor nanocrystal may be also within a bandgap energy of the second semiconductor nanocrystal.

The second semiconductor nanocrystal (Group III-VI) may have a band gap greater than that of the first semiconductor nanocrystal. For example, the bandgap energy of the second semiconductor nanocrystal may be greater than about 1.0 time and about 3.0 times or less, about 2.5 times or less, about 2.0 times or less, or about 1.5 times or less the bandgap energy of the first semiconductor nanocrystal.

In an embodiment, the second shell 6 may include a plurality of layers, and the third semiconductor nanocrystal included in the layer closest to the first shell 4 among the plurality of layers may have a smaller bandgap energy than the second semiconductor nanocrystal of the first shell 4.

In an embodiment, the second shell 6 may include a plurality of layers, and the third semiconductor nanocrystal included in the layer closest to the first shell 4 among the plurality of layers may have a larger energy bandgap than the second semiconductor nanocrystal of the first shell 4.

In an embodiment, the bandgap energy of the second semiconductor nanocrystal and the bandgap energy of the third semiconductor nanocrystal may be the same or different. In an embodiment, a bandgap energy of the second semiconductor nanocrystal may be greater than a bandgap energy of the third semiconductor nanocrystal. In an embodiment, a bandgap energy of the second semiconductor nanocrystal may be smaller than a bandgap energy of the third semiconductor nanocrystal.

The second semiconductor nanocrystal including the Group III-VI compound included in the first shell 4 is present between the core 2 and the second shell 6 to reduce defects in quantum dot, to increase efficiency, and to reduce the full width at half maximum (FWHM), and may enable a uniform coating of the second shell 6.

A lattice mismatch of the first semiconductor nanocrystal and the second semiconductor nanocrystal may be less than or equal to about 15%, for example, less than or equal to about 14%, less than or equal to about 13%, less than or equal to about 12%, less than or equal to about 11%, or less than or equal to about 10%. Thereby, the possibility of crystalline defects in the core including the first semiconductor nanocrystal and the first shell including the second semiconductor nanocrystal may be reduced or alleviated. Herein, the lattice mismatch ratio may be calculated according to Equation 2.

$$|a_1-a_2|/a_1 \times 100 \qquad \text{[Equation 2]}$$

wherein $a_1$ is a lattice constant of the first semiconductor nanocrystal and $a_2$ is a lattice constant of the second semiconductor nanocrystal.

The quantum dot 1 may further include a third shell (not shown) including a fourth semiconductor nanocrystal including a Group III-VI compound, a Group II-VI compound, a Group III-V compound, or a combination thereof disposed on the second shell 6. As the Group III-VI compound of the fourth semiconductor nanocrystal, the aforementioned second semiconductor nanocrystal may be used. The Group III-VI compound of the fourth semiconductor nanocrystal may have the same or a different composition from the Group III-VI compound of the second semiconductor nanocrystal. The Group II-VI compound and the Group III-V compound of the fourth semiconductor nanocrystal are the same as described herein.

The thickness of the core 2 and each shell (the first shell 4 and the second shell 6 may be adjusted taking into consideration a desired emission wavelength and the composition of the quantum dot 1. In the quantum dot (1) according to an embodiment, the diameter of the core 2 may be greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, greater than or equal to about 2.1 nm, greater than or equal to about 2.2 nm, greater than or equal to about 2.3 nm, greater than or equal to about 2.4 nm, greater than or equal to about 2.5 nm, greater than or equal to about 2.6 nm, greater than or equal to about 2.7 nm, greater than or equal to about 2.8 nm, greater than or equal to about 2.9 nm, or greater than or equal to about 3.0 nm. The diameter of the core 2 may be less than or equal to about 4 nm, less than or equal to about 3.5 nm, less than about 3.5 nm, less than or equal to about 3.4 nm, less than or equal to about 3.3 nm, less than or equal to about 3.2 nm, less than or equal to about 3.1 nm, less than or equal to about 3 nm, less than or equal to about 2.9 nm, or less than or equal to about 2.8 nm.

A thickness of the first shell 4 may be greater than or equal to about 0.2 nm, for example, greater than or equal to about 0.3 nm, or greater than or equal to about 0.4 nm. The thickness of the first shell 4 may be less than or equal to about 1.5 nm, for example, less than or equal to about 1.4 nm, less than or equal to about 1.35 nm, less than or equal to about 1.33 nm, less than or equal to about 1.32 nm, less than or equal to about 1.31 nm, less than or equal to about 1.3 nm, less than or equal to about 1.2 nm, less than or equal to about 1.1 nm, less than or equal to about 1.0 nm, less than or equal to about 0.9 nm, less than or equal to about 0.8 nm, less than or equal to about 0.7 nm, or less than or equal to about 0.6 nm.

A thickness of the second shell 6 may be greater than or equal to about 0.5 nm, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm and less than or equal to about 4 nm, less than or equal to about 3.5 nm, less than or equal to about 3.0 nm, less than or equal to about 2.9 nm, less than or equal to about 2.8 nm, less than or equal to about 2.7 nm, less than or equal to about 2.6 nm, less than or equal to about 2.4 nm, less than or equal to about 2.3 nm, less than or equal to about 2.2 nm, less than or equal to about 2.1 nm, or less than or equal to about 2.0 nm.

When the third shell is formed, it may be formed in the thickness range of the second shell described herein.

The quantum dots of an embodiment may exhibit improved size distribution by having the aforementioned composition and structure.

The quantum dot may emit blue light or green light, and the maximum emission peak of the quantum dot may be less than or equal to about 560 nm, for example less than or equal to about 550 nm, less than or equal to about 540 nm, less than or equal to about 530 nm, less than or equal to about 520 nm, less than or equal to about 510 nm, less than or equal to about 500 nm, less than or equal to about 495 nm, less than or equal to about 493 nm and greater than or equal to about 450 nm, for example, greater than or equal to about 455 nm, or greater than or equal to about 460 nm. The full width at half maximum (FWHM) of the quantum dot according to an embodiment may be less than or equal to about 40 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, or less than or equal to about 26 nm.

In the UV-Vis absorption spectrum curve of the quantum dot, an absorption peak may be exhibited at less than or equal to about 550 nm, for example less than or equal to about 540 nm, less than or equal to about 530 nm, less than or equal to about 520 nm, less than or equal to about 510 nm, less than or equal to about 500 nm, less than or equal to about 490 nm, less than or equal to about 480 nm, less than or equal to about 470 nm, less than or equal to about 465 nm, less than or equal to about 464 nm, less than or equal to about 463 nm, less than or equal to about 462 nm, less than or equal to about 461 nm, or less than or equal to about 460 nm.

The quantum dot according to an embodiment may exhibit quantum efficiency of greater than or equal to about 55%, for example, greater than or equal to about 60%, greater than or equal to about 65%, greater than or equal to about 70%, greater than or equal to about 75%, greater than or equal to about 80%, greater than or equal to about 85%, greater than or equal to about 90%, greater than or equal to about 95%, or greater than or equal to about 100%.

The quantum dot according to an embodiment may have a size of greater than or equal to about 4 nm, greater than or equal to about 5 nm, or greater than or equal to about 6 nm. The quantum dot according to an embodiment may have a size of less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, or less than or equal to about 10 nm. Herein the size of the quantum dot may refer to a diameter (or diameters calculated from electron microscope two-dimensional (2D) images of the quantum dot under the assumption that the quantum dot has a spherical shape, when the quantum dot does not a have spherical shape). Here, the size may be a size of a single quantum dot or an average size of a population of quantum dots. The size of the quantum dot may be obtained, for example, using an image analysis program (e.g., image J) for transmission electron microscopy images.

The quantum dot may include an organic ligand on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RR'POOH (wherein, R and R' may each independently include a substituted or unsubstituted C1 to C40 aliphatic hydrocarbon group (e.g., a C1 to C40 alkyl group, a C2 to C40 alkenyl group, a C2 to C40 alkynyl group, and the like), a substituted or unsubstituted C6 to C40 aromatic hydrocarbon group (e.g., a C6 to C20 aryl group, a C3 to C20 heteroaryl group, and the like), or combination thereof). The organic ligand may coordinate, e.g., bind to, the surface of the prepared quantum dots (nanocrystals), aid dispersion of the nanocrystals in a solution phase, affect the light emitting and electrical characteristics of the quantum dots, or a combination thereof. Specific examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a phosphine such as substituted or unsubstituted methyl phosphine (e.g., trimethyl phosphine, methyldiphenyl phosphine, and the like), a substituted or unsubstituted ethyl phosphine (e.g., triethyl phosphine, ethyldiphenyl phosphine, and the like), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; a phosphine oxide such as substituted or unsubstituted methyl phosphine oxide (e.g., trimethyl phosphine oxide, methyldiphenyl phosphine oxide, and the like), a substituted or unsubstituted ethyl phosphine oxide (e.g., triethyl phosphine oxide, ethyldiphenyl phosphine oxide, and the like), a substituted or unsubstituted propyl phosphine oxide, a substituted or unsubstituted butyl phosphine oxide, a substituted or unsubstituted octyl phosphine oxide (e.g., trioctyl phosphine oxide (TOPO), and the like; diphenyl phosphine, triphenyl phosphine compound, or an oxide compound thereof; phosphonic acid, and the like, but are not limited thereto. The organic ligand may be used alone or as a mixture of two or more. The organic ligand may be a mixture of carboxylic acid and amine.

The organic ligand may not include a compound having both a carboxylic acid group and a thiol group (e.g., glutathione). Such a quantum dot may be water insoluble.

The aforementioned quantum dot may be synthesized using various preparing methods, for example, a method of preparing quantum dot including a core and a shell. The quantum dot according to an embodiment may be prepared by colloidal synthesis, and thus may include an organic ligand, an organic solvent to be described herein, or a combination thereof on the surface thereof. The organic ligand, the organic solvent, or the combination thereof may be bound to the surface of the quantum dot.

The quantum dot having a configuration according to FIG. 1 described herein may be prepared by a process including preparing a core including a first semiconductor nanocrystal; forming a first shell including a Group III-VI compound on the core; and forming a second shell including a third semiconductor nanocrystal on the first shell.

Metal and non-metal precursors may be appropriately selected according to the composition of the core, the first shell, and the second shell. The metal precursors may include metal powders, alkylated metals, metal carboxylates, metal hydroxides, metal halides, metal oxides, metal inorganic salts (such as nitrates), metal sulfates, metal acetylacetonates, or combinations thereof, but are not limited thereto. The non-metal precursors may be a non-metallic elements-containing compound that may be used in quantum dot synthesis.

In the following preparation process, a case in which the first semiconductor nanocrystal included in the core includes a Group III-V compound will be described.

First, in order to form a core, a Group III element precursor and a Group V element precursor are reacted in an organic solvent in the presence of an organic ligand.

The organic ligand is the same as described herein.

The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon group (e.g., alkane, alkene, alkyne, etc.) such as hexadecane, octadecane, octadecene, or squalane; a C6 to C30 aromatic hydrocarbon group such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide; a C12 to C22 aromatic ether such as phenyl ether, or benzyl ether, or a combination thereof. The type and amount of the solvent may be appropriately selected taking into consideration the types of precursors and organic ligands.

The type of the Group Ill element precursor and the Group V element precursor is not particularly limited and may be appropriately selected. When the Group Ill element is indium, examples of the indium precursor may include trimethyl indium, indium carboxylate such as indium acetate, indium palmitate, and indium stearate, indium hydroxide, indium chloride, indium oxide, indium nitrate, indium sulfate, or a combination thereof. When the Group V element is phosphorus, examples of the phosphorus precursor may include tris(trimethylsilyl)phosphine, tris(dimethylamino)phosphine, triethylphosphine, tributylphosphine, trioctylphosphine, triphenylphosphine, tricyclohexylphosphine, or a combination thereof.

When the first semiconductor nanocrystals included in the core include a heteroelement of zinc, aluminum, or a combination thereof, these precursors may be reacted with the Group Ill element precursor and the Group V element precursor to prepare the core. Examples of the zinc precursor may include Zn metal powder, alkylated Zn compounds (dimethylzinc, diethylzinc, etc.), Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. The type of the precursor for the aluminum may be appropriately selected. Examples of the aluminum precursor may include an aluminum metal powder, an aluminum carboxylate such as aluminum oleate, aluminum monostearate, aluminum octanoate, or aluminum acetylacetonate, an aluminum halide such as aluminum chloride, an aluminum alkoxide such as aluminum isopropoxide, aluminum oxide, alkylated aluminum, or a combination thereof.

The core is formed by reacting the Group Ill element precursor, the Group V element precursor, and optionally a precursor of a heteroelement. The reaction may be carried out at a temperature of greater than or equal to about 280° C., for example, greater than or equal to about 290° C. The reaction temperature may be less than or equal to about 350° C. The reaction time is controlled to be less than about 1 hour, for example less than or equal to about 50 minutes. The reaction time may be greater than or equal to about 20 minutes, for example, greater than or equal to about 30 minutes.

The formed core may be separated by adding a non-solvent, but the present disclosure is not limited thereto. For example, when a nonsolvent is added to the prepared final reaction solution, nanocrystals coordinated with the organic ligand may be separated (e.g., precipitated). The separated core may be washed using the non-solvent. The non-solvent may be a polar solvent that is miscible with the solvent used in the reaction but cannot disperse the nanocrystals.

The non-solvent may be determined depending on the solvent used in the reaction, and may be, for example, acetone, ethanol, butanol, isopropanol, ethanediol, water, tetrahydrofuran (THF), dimethyl sulfoxide (DMSO), diethyl ether, formaldehyde, acetaldehyde, a solvent having solubility parameters similar to those of the forgoing non-solvents, or a combination thereof. Separation may use centrifugation, precipitation, chromatography, or distillation. The separated nanocrystals may be washed by being added to a washing solvent as needed. The washing solvent is not particularly limited, and a solvent having a solubility parameter similar to that of the ligand may be used, and examples thereof may include hexane, heptane, octane, chloroform, toluene, and benzene.

In order to form the first shell on the core, a Group III element precursor and a Group VI element precursor may be reacted in the presence of an organic ligand and the core, in an organic solvent.

The Group III element precursor is the same as described for the core. When the Group III element is gallium, examples of the gallium precursor may include trimethylgallium, triethylgallium, gallium carboxylate such as gallium acetate, gallium palmitate, gallium stearate, gallium acetylacetonate, gallium hydroxide, gallium chloride, gallium oxide, gallium nitrate, gallium sulfate, or a combination thereof. When the Group III element is indium, examples of the indium precursor may include trimethylindium, triethylindium, indium carboxylate such as indium acetate, indium palmitate, or indium stearate, indium acetylacetonate, indium hydroxide, indium chloride, indium oxide, indium nitrate, indium sulfate, or a combination thereof.

The Group VI element precursor may include a chalcogen element. For example, when the Group VI element is sulfur, examples of the sulfur precursor may include a sulfur powder, hexane thiol, octane thiol, decane thiol, dodecane thiol, hexadecane thiol, mercaptopropyl silane, alkylphosphine such as sulfur-trioctylphosphine (S-TOP) or sulfur-tributylphosphine (S-TBP), arylphosphine such as sulfur-triphenylphosphine (S-TPP), sulfur-trioctylamine (S-TOA), bistrimethylsilyl sulfur, ammonium sulfide, sodium sulfide, or a combination thereof. In addition, when the Group VI element is selenium, the selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof. When the Group VI element is tellurium, examples of the tellurium precursor may include tellurium-tributylphosphine (Te-TBP), tellurium-triphenylphosphine (Te-TPP), tellurium-diphenylphosphine (Te-DPP), or a combination thereof, but is not limited thereto.

The reaction for the formation of the first shell may be performed at a temperature of greater than or equal to about 80° C., for example, greater than or equal to about 90° C., greater than or equal to about 100° C., greater than or equal to about 110° C., greater than or equal to about 120° C., or greater than or equal to about 140° C. and less than or equal to about 300° C., less than or equal to about 290° C., less than or equal to about 280° C., less than or equal to about 270° C., or less than or equal to about 260° C.

The reaction time for the formation of the first shell may be adjusted taking into consideration the reactivity of the precursor, the reaction temperature, and the desired thickness of the first shell. In an embodiment, the reaction time may be adjusted to less than about 4 hours, for example, less than or equal to about 3 hours. The reaction time may be greater than or equal to about 20 minutes, for example, greater than or equal to about 30 minutes.

The particles on which the first shell is formed may be separated by adding a non-solvent to the reaction system. The separated particles may optionally be subjected to washing. In the formation of the first shell, details of the organic ligand, non-solvent, etc. are the same as those described in the core.

In order to form a second shell on the first shell, in the presence of an organic ligand and a core on which the first shell is formed, a Group II element precursor and a Group VI element precursor; or a Group III element precursor and a Group V element precursor are reacted in an organic solvent. When the Group II element is zinc, examples of the zinc precursor may include a Zn metal powder, an alkylated Zn compound (e.g., dimethylzinc, diethylzinc, etc.), Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. The Group VI element precursor is the same as described for the second semiconductor nanocrystal.

The reaction to form the second shell may be performed at a temperature greater than about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C., and less than or equal to about 350° C., for example, or less than or equal to about 340° C.

The reaction time for the formation of the second shell may be adjusted taking into consideration the reactivity of the precursor, the reaction temperature, and the desired thickness of the second shell. In an embodiment, the reaction time may be adjusted to less than about 3 hours, for example, less than or equal to about 2 hours, or less than or equal to about 1 hour. The reaction time may be greater than or equal to about 20 minutes, for example, greater than or equal to about 30 minutes.

In each of the disclosed steps, the type/content or content ratio of the precursor may be determined taking into consideration the composition in the final quantum dots (core, first shell, and second shell) and reactivity between precursors.

Prior to the reaction of each of the processes described herein (e.g., core formation, first shell formation, and second shell formation), the metal precursor may be heated (or vacuum-treated) in advance under vacuum together with a solvent and optionally an organic ligand compound at a predetermined temperature (e.g., greater than or equal to about 100° C.), followed by converting into an inert gas atmosphere, and then heating it again to a predetermined temperature (e.g., greater than or equal to about 100° C.).

The injection of the metal precursor, the non-metal precursor, or a combination thereof may be performed sequentially or simultaneously, and the injection temperature of the precursor may be appropriately determined. For example, when the first shell, the second shell, or each of the first shell and the second shell is formed in multiple layers, the metal precursor, non-metal precursor, or a combination thereof for the first shell and the second shell may be introduced several times during the reaction time at different ratios.

The quantum dots may be non-dispersible or non-soluble in water, the aforementioned non-solvent, or a combination thereof.

The quantum dots may be dispersed in the aforementioned organic solvent. For example, the quantum dots may be dispersed by a C6 to C40 aliphatic hydrocarbon, a C6 to C40 substituted or unsubstituted aromatic hydrocarbon, or a combination thereof.

The aforementioned quantum dots may be included in the quantum dot composition. The quantum dot composition may include an organic solvent, a liquid vehicle, or a combination thereof, and may further include, optionally, a polymerizable monomer including a carbon-carbon double bond, and a (photo) initiator. The content of the quantum dots in the composition may be appropriately adjusted taking into consideration the final use and composition of the composition. The content of quantum dots may be greater than or equal to about 0.1 weight percent (wt %), greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. In addition, the content of quantum dots may be less than or equal to about 70 wt %, less than or equal to about 65 wt %, less than or equal to about 60 wt %, less than or equal to about 55 wt %, or less than or equal to about 50 wt %, based on a solid content of the composition.

The quantum dot composition may be a photosensitive composition capable of forming a pattern using a photolithography process or an inkjet composition capable of forming a pattern using an inkjet process.

The quantum dot composition may further include a compound including a carboxylic acid group. Such a compound may include, for example, a monomer compound including a carboxylic acid group and a carbon-carbon double bond, a monomer compound including a multiple aromatic ring and a carboxylic acid group (—COOH), or a combination thereof.

For specific descriptions on the quantum dot composition (e.g., photosensitive composition), US-2017-0059988-A1 may be referred, the entire contents of which are incorporated herein by reference.

The quantum dot-polymer composite may be configured in a form in which the aforementioned quantum dots are dispersed in a polymer matrix.

The content of the quantum dots in the polymer matrix may be appropriately selected and is not particularly limited. For example, the content of the quantum dots in the polymer matrix may be greater than or equal to about 0.1 wt % and less than or equal to about 70 wt %, based on the total weight of the composite, but is not limited thereto. For example, the amount of quantum dots in the polymer matrix may be greater than or equal to about 0.3 wt %, greater than or equal to about 0.2 wt %, or greater than or equal to about 1.0 wt % and less than or equal to about 65 wt %, less than or equal to about 60 wt %, less than or equal to about 55 wt %, or less than or equal to about 50 wt %, based on the total weight of the composite.

The polymer matrix may include a thiolene polymer, a (meth)acrylate polymer (i.e., a polymer derived from a methacrylate, an acrylate, or a combination thereof, a urethane polymer, an epoxy polymer, a vinyl polymer, a silicone, or a combination thereof. The thiolene polymer is disclosed in detail in US 2015-0218444 A1, the entire contents of which are incorporated herein by reference. The (meth)acrylate polymer, urethane polymer, epoxy polymer, vinyl-based polymer, and silicone may be synthesized by a suitable method or a commercially available formulation may be used to provide the polymer.

The quantum dot-polymer composite may further include metal oxide particulates (fillers and/or light diffusing agents) in the form of, for example, fine particles. The metal oxide particulate may include, for example, $SiO_2$, $ZnO$, $TiO_2$, $ZrO_2$, or a combination thereof.

The quantum dot-polymer composite may be in the form of a sheet.

The quantum dot-polymer composite may be in the form of a quantum dot laminate structure disposed on a substrate. The quantum dot laminate structure may have a quantum dot-polymer composite pattern including a, e.g., at least one, repeating section that emit light of a predetermined wavelength. The quantum dot-polymer composite pattern may include a first section that emits a first light, a second section that emits a second light, or a combination thereof. The first section and the second section may each independently include quantum dots that emit light of different wavelengths.

In a method of manufacturing a quantum dot laminate structure, a film of a quantum dot composition is formed on a substrate, a selected region of the film is exposed to light having a predetermined wavelength (for example, a wavelength of less than or equal to about 400 nm), and the exposed film is developed by an alkali developer to obtain a pattern of the quantum dot-polymer composite.

The quantum dot composition is as described herein. The aforementioned quantum dot composition may be applied to a predetermined thickness by using a suitable method such as spin coating or slit coating on a substrate to form a film, and the formed film may be subjected to pre-baking (PRB) as needed. Conditions such as temperature, time, and atmosphere of the pre-baking may be appropriately selected.

The formed (or optionally pre-baked) film may be exposed to light having a predetermined wavelength (for example, a wavelength of less than or equal to about 400 nm) under a mask having a predetermined pattern, and the wavelength and intensity of the light may be selected taking into consideration the type and amount of the photoinitiator, the type and amount of quantum dots, and the like.

When the exposed film is treated with an alkali developer (e.g., dipped or sprayed), the portion of the film not irradiated with light is dissolved and a desired pattern is obtained. The obtained pattern may be post-baked (FOB) for a predetermined time (e.g., greater than or equal to about 10 minutes, or greater than or equal to about 20 minutes) at a temperature of about 150° C. to about 230° C., for example, in order to improve the crack resistance and solvent resistance of the pattern, if desired.

When the pattern of the quantum dot-polymer composite has a plurality of repeating sections, a plurality of composition including quantum dots (e.g., red light-emitting quantum dots, green light-emitting quantum dots, or optionally blue light-emitting quantum dots) having desired emission properties (photoluminescence peak wavelength, etc.) for forming each repeating section may be prepared, and then the aforementioned pattern formation process for each composition may be repeated an appropriate number of times (e.g., 2 or more times, or 3 or more times) to obtain a quantum dot-polymer composite having a desired pattern.

An ink composition including the aforementioned quantum dots and a liquid vehicle may be used for pattern formation. For example, an ink composition including quantum dots, a liquid vehicle, and a monomer is deposited on a desired area of the substrate, polymerization is performed after optionally removing the liquid vehicle, or the liquid vehicle is removed to form a pattern. The quantum dot-polymer composite pattern may be a pattern in which two or more different color-emitting sections (e.g., RGB color sections) are repeated, and the quantum dot-polymer composite pattern may be used as a photoluminescent color filter in a display device.

The aforementioned quantum dots may be included in an electronic device. Such an electronic device may include a (electroluminescent or photoluminescent) display device, a light emitting diode (LED), an organic light emitting diode (OLED), a quantum dot LED, a sensor, a solar cell, an imaging sensor, a photodetector, or a liquid crystal display device, but is not limited thereto.

The aforementioned quantum dots may be included in an electronic apparatus. Such an electronic apparatus may include, but are not limited to, a portable terminal device, a monitor, a notebook personal computer (PC), a television, an electric signboard, a camera, and an automobile. The electronic apparatus may be a portable terminal device, a monitor, a notebook PC, or a television including a display device including quantum dots. The electronic apparatus may be a camera or a portable terminal device including an image sensor including quantum dots. The electronic apparatus may be a camera or a car including a photodetector including quantum dots.

Figure 2:
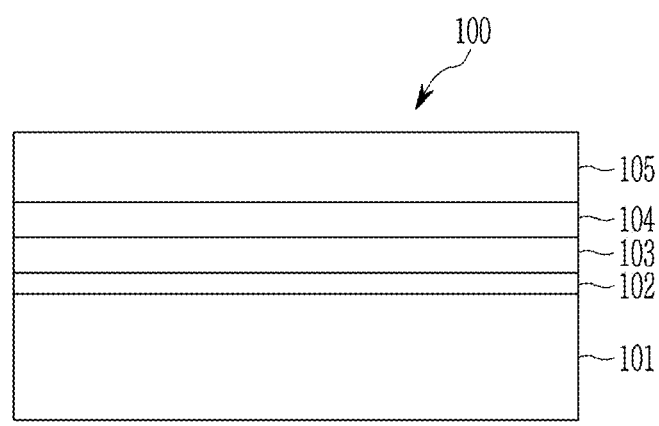
FIG. 2 is a schematic cross-sectional view of an electroluminescent display device according to an embodiment.

Hereinafter, an electroluminescent device as an example of an electronic device will be described with reference to FIG. 2. FIG. 2 is a schematic cross-sectional view of an electroluminescent display device according to an embodiment.

Referring to FIG. 2, the electroluminescent device 100 includes a first electrode 101 and a second electrode 105 facing each other, and an active layer 103 disposed between the first electrode 101 and the second electrode 105 and including the aforementioned quantum dots.

For example, in the quantum dots of the active layer 103, electrons and holes injected from the first electrode 101 and the second electrode 105 are recombined to form an exciton, and the active layer 103 may be a light emitting layer capable of emitting light of a certain wavelength by the energy of the formed excitons. In addition, an electronic device including a quantum dot may be a photo detector or a solar cell. For example, the quantum dots of the active layer 103 may be a light absorption layer that provides electrons and holes to the first electrode 101 and the second electrode 105 by absorbing external photons and separating them into electrons and holes.

The hole auxiliary layer 102 may be disposed between the first electrode 101 and the active layer 103, and the electron auxiliary layer 104 may be disposed between the second electrode 105 and the active layer 103.

The electroluminescent device 100 may further include a substrate (not shown). The substrate may be disposed on the first electrode 101 side or on the second electrode 105 side. The substrate may be a substrate including an insulating material (e.g., an insulating transparent substrate). In addition, the substrate may include glass, various polymers such as polyester (e.g., polyethyleneterephthalate (PET), polyethylenenaphthalate (PEN)), polycarbonate, polyacrylate, polyimide, polyamideimide, and the like, inorganic materials such as polysiloxane (e.g., polydimethylsiloxane (PDMS)), $Al_2O_3$, ZnO, and the like, or a combination thereof, or may be made of a silicon wafer. Herein, "transparent" refers to that transmittance through which light of a certain wavelength (e.g., light emitted from the quantum dots) passes is greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected considering a substrate material, and the like, but is not particularly limited. The transparent substrate may have flexibility.

One of the first electrode 101 and the second electrode 105 may be an anode and the other may be a cathode. For example, the first electrode 101 may be an anode and the second electrode 105 may be a cathode.

The first electrode 101 may be made of a conductor, for example, a metal, a conductive metal oxide, or a combination thereof. The first electrode 101 may be, for example, made of a metal such as nickel, platinum, vanadium, chromium, copper, zinc, gold or an alloy thereof, a conductive metal oxide such as zinc oxide, indium oxide, tin oxide, indium tin oxide (ITO), indium zinc oxide (IZO), or fluorine doped tin oxide, or a combination of a metal and an oxide such as ZnO and Al or $SnO_2$ and Sb, but is not limited thereto. The second electrode 105 may be made of a conductor, for example a metal, a conductive metal oxide, a conductive polymer, or a combination thereof. The second electrode 105 may be for example made of a metal such as aluminum, magnesium, calcium, sodium, potassium, titanium, indium, yttrium, lithium, gadolinium silver, gold, platinum, tin, lead, cesium, barium, or an alloy thereof, a multi-layered structure material such as LiF/Al, lithium oxide ($Li_2O$)/Al, Liq/Al, LiF/Ca, and $BaF_2$/Ca, but is not limited thereto. The conductive metal oxide is the same as described herein.

The work functions of the first electrode 101 and the second electrode 105 is not particularly limited and may be appropriately selected. The work function of the first electrode 101 may be higher or lower than the work function of the second electrode 105.

At least one of the first electrode 101 and the second electrode 105 may be a light-transmitting electrode, and the light-transmitting electrode is, for example, a conductive metal oxide such as zinc oxide, indium oxide, tin oxide, indium tin oxide (ITO), indium zinc oxide (IZO), fluorine-doped tin oxide, or a single or multi-layer metal thin film. When any one of the first electrode 101 and the second electrode 105 is an opaque electrode, it may be made of an opaque conductor such as aluminum (Al), silver (Ag), or gold (Au).

The thicknesses of the first electrode 101, the second electrode 105, or each of the first 101 and the second electrode 105 are not particularly limited, and may be appropriately selected taking into consideration the device efficiency. For example, the thickness of each of the electrodes may be greater than or equal to about 5 nm, for example, greater than or equal to about 50 nm and less than or equal to about 100 μm, for example, less than or equal to about 10 μm, less than or equal to about 1 μm, less than or equal to about 900 nm, less than or equal to about 500 nm, or less than or equal to about 100 nm.

The active layer 103 includes the quantum dots described herein. The active layer 103 may include quantum dot layers of a monolayer or a plurality of monolayers. The plurality of monolayers may be 2 or more, 3 or more, or 4 or more, and may be 20 or less, 10 or less, 9 or less, 8 or less, 7 or less, or 6 or less. The active layer 103 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 103 may have a thickness of about 10 nm to about 150 nm, about 10 nm to about 100 nm, or about 10 nm to about 50 nm.

The electroluminescent device 100 may further include a hole auxiliary layer 102. The hole auxiliary layer 102 may be disposed between the first electrode 101 and the active layer 103. The hole auxiliary layer 102 may include a hole injection layer, a hole transport layer, an electron blocking layer, or a combination thereof. The hole auxiliary layer 102 may be a single component layer or a multilayer structure in which adjacent layers include different components.

The highest occupied molecular orbital (HOMO) energy level of the hole auxiliary layer 102 may have a HOMO energy level that may be matched with the HOMO energy level of the active layer 103 in order to enhance mobility of holes transferred from the hole auxiliary layer 102 to the active layer 103. As an example, the hole auxiliary layer 102 may include a hole injection layer disposed close to the first electrode 101 and a hole transport layer disposed close to the active layer 103.

The material included in the hole auxiliary layer 102 (e.g., a hole transport layer or a hole injection layer) is not particularly limited, and may include, for example, poly(9,9-dioctyl-fluorene-co-N-(4-butylphenyl)-diphenylamine) (TFB), polyarylamine, poly(N-vinylcarbazole) (PVK), poly (3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino)phenyl] cyclohexane (TAPC), p-type metal oxide (e.g., NiO, $WO_3$, $MoO_3$, etc.), a carbon-based (i.e., carbon-containing) material such as graphene oxide, or a combination thereof, but is not limited thereto.

When the electron blocking layer is included, the electron blocking layer may include poly(3,4-ethylenedioxythiophene):poly(styrenesulfonate) (PEDOT:PSS), poly(9,9-di-octyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, for example, less than or equal to about 40 nm, less than or equal to about 35 nm, or less than or equal to about 30 nm, but is not limited thereto.

The electron auxiliary layer 104 may be disposed between the active layer 103 and the second electrode 105. The electron auxiliary layer 104 may include, for example, an electron injection layer that facilitates electron injection, an electron transport layer that facilitates electron transport, and a hole blocking layer that blocks the movement of holes, or a combination thereof. For example, an electron injection layer may be disposed between the electron transport layer and the second electrode 105. For example, the hole blocking layer may be disposed between the active layer and the electron transport (injection) layer, but is not limited thereto. The thickness of each layer may be appropriately selected, for example, the thickness of each layer may be greater than or equal to about 1 nm and less than or equal to about 500 nm, but is not limited thereto. The electron injection layer may be an organic layer formed by vapor deposition, and the electron transport layer may include inorganic oxide nanoparticles.

The electron transport layer may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl) phenyl)quinolone), 8-hydroxyquinolinato lithium (Liq), n-type metal oxide (e.g., ZnO, HfO$_2$, etc.), or a combination thereof, but is not limited thereto. In the foregoing "q" is 8-hydroxyquinoline, "BTZ" is 2-(2-hydroxyphenyl)benzothiazolate, and "Bq" is 10-hydroxybenzo[h]quinoline.

In addition, the electron transport layer may include a plurality of nanoparticles. The nanoparticles may include metal oxides including zinc, for example, zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof and 0≤x≤0.5). In the chemical formula, x may be greater than or equal to about 0.01 and less than or equal to about 0.3, for example, less than or equal to about 0.25, less than or equal to about 0.2, or less than or equal to about 0.15. An absolute value of the lowest unoccupied molecular orbital (LUMO) energy level of the aforementioned quantum dots included in the active layer may be smaller than an absolute value of LUMO energy level of the metal oxide. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The hole blocking layer (HBL) may include, for example, 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, or a combination thereof, but is not limited thereto.

Each thickness of the electron auxiliary layer 104 (e.g., electron injection layer, electron transport layer, or hole blocking layer) may be greater than or equal to about 5 nm 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 3:
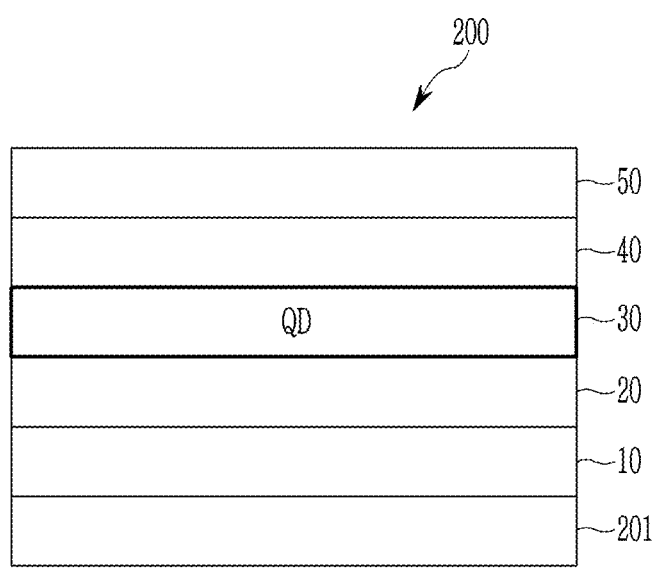
FIG. 3 is a schematic cross-sectional view of an electroluminescent display device according to an embodiment.

Referring to FIG. 3, an electroluminescent device according to an embodiment may have a normal structure. An electroluminescent device 200 may include an anode 10 disposed on the transparent substrate 201 and a cathode 50 facing the anode 10. The anode 10 may include a metal oxide-based transparent electrode, and the cathode 50 facing the anode 10 may include a conductive metal having a relatively low work function. For example, the anode 10 may include an indium tin oxide (ITO, work function of about 4.6 eV to about 5.1 eV) electrode, and the cathode 50 may include an electrode including magnesium (Mg, a work function of about 3.66 eV), aluminum (Al, work function of about 4.28 eV), or a combination thereof. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10 and the hole transport layer may be disposed close to the quantum dot active layer 30. Also, the electron auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30.

Figure 4:
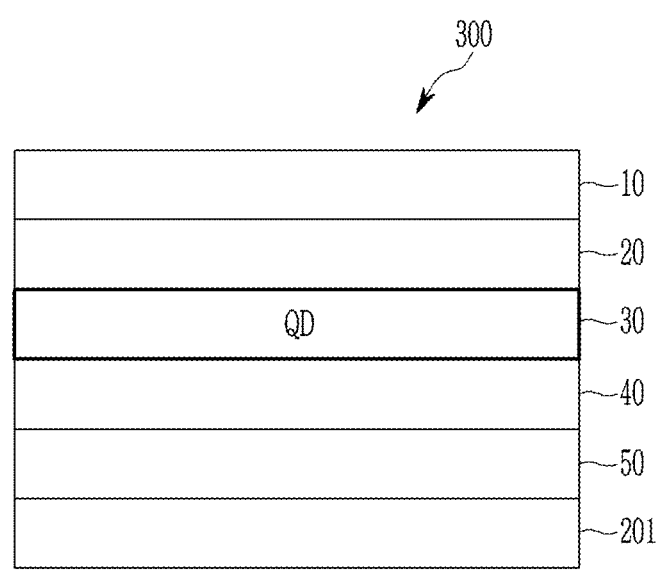
FIG. 4 is a schematic cross-sectional view of an electroluminescent display device according to an embodiment.

Referring to FIG. 4, an electroluminescent device according to an embodiment may have an inverted structure. The electroluminescent device 300 having an inverted structure may include a cathode 50 disposed on the transparent substrate 100 and an anode 10 facing the cathode 50. The cathode 50 may include a metal oxide-based transparent electrode, and the anode 10 facing the cathode 50 may include a conductive metal having a relatively high work function. For example, the cathode 50 may be an indium tin oxide (ITO, work function of about 4.6 eV to about 5.1 eV) electrode, the anode 10 may be an electrode including gold (Au, a work function of about 5.1 eV), silver (Ag, work function of about 4.26 eV), aluminum (Al, a work function of 4.28 eV), or a combination thereof. Also, the electronic auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30. The electron auxiliary layer 40 may include, for example, a metal oxide in the electron transport layer, and a crystalline Zn oxide or an n-type doped metal oxide. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10, and the hole transport layer may be disposed close to the quantum dot active layer 30. The hole transport layer may include TFB, PVK, or a combination thereof, and the hole injection layer may include $MoO_3$ or other p-type metal oxides.

In the electroluminescent device, light of a certain wavelength generated in the active layer 30 is emitted to the outside through the light-transmitting electrode and the transparent substrate. For example, referring to FIG. 3, when a metal oxide-based transparent electrode (e.g., indium tin oxide (ITO)), which is a light-transmitting electrode, is applied to the anode 10, the light formed in the active layer emitted to the outside through the anode 10 and the transparent substrate 201. Referring to FIG. 4, when a metal oxide-based transparent electrode (e.g., indium tin oxide (ITO)), which is a light-transmitting electrode, is applied to the cathode 50, light formed in the active layer is emitted to the outside through the cathode 50 and the transparent substrate 201.

The aforementioned electronic device may be produced by a suitable method. For example, the electroluminescent device may be produced by forming a hole auxiliary layer (or an electron auxiliary layer) on a substrate on which an electrode is formed, forming an active layer including quantum dots (e.g., a pattern of the aforementioned quantum dots), and forming an electron auxiliary layer (or a hole auxiliary layer) and an electrode. The electrode, the hole auxiliary layer, and the electron auxiliary layer may each be independently formed by a suitable method, and may be formed, for example, by vapor deposition or coating, but are not particularly limited.

Other electronic devices including the aforementioned quantum dots may include a light source and a light emitting element. The light emitting element may include the aforementioned quantum dots, and the light source may be configured to provide incident light to the light emitting element. Such an electronic device may be a photoluminescent display device.

Incident light provided from the light source may have a photoluminescence peak wavelength in a range of greater than or equal to about 400 nm, for example, greater than or equal to about 430 nm, or greater than or equal to about 440 nm, and less than or equal to about 500 nm, for example, less than or equal to about 490 nm, or less than or equal to about 480 nm. The light emitting element may have a form in which the aforementioned quantum dots are dispersed in a polymer matrix. For example, the light emitting element may be a quantum dot-polymer composite implemented in a sheet form.

The photoluminescent display device according to an embodiment may further include a liquid crystal panel, and a sheet of a quantum dot-polymer composite may be disposed between the light source and the liquid crystal panel.

Figure 5:
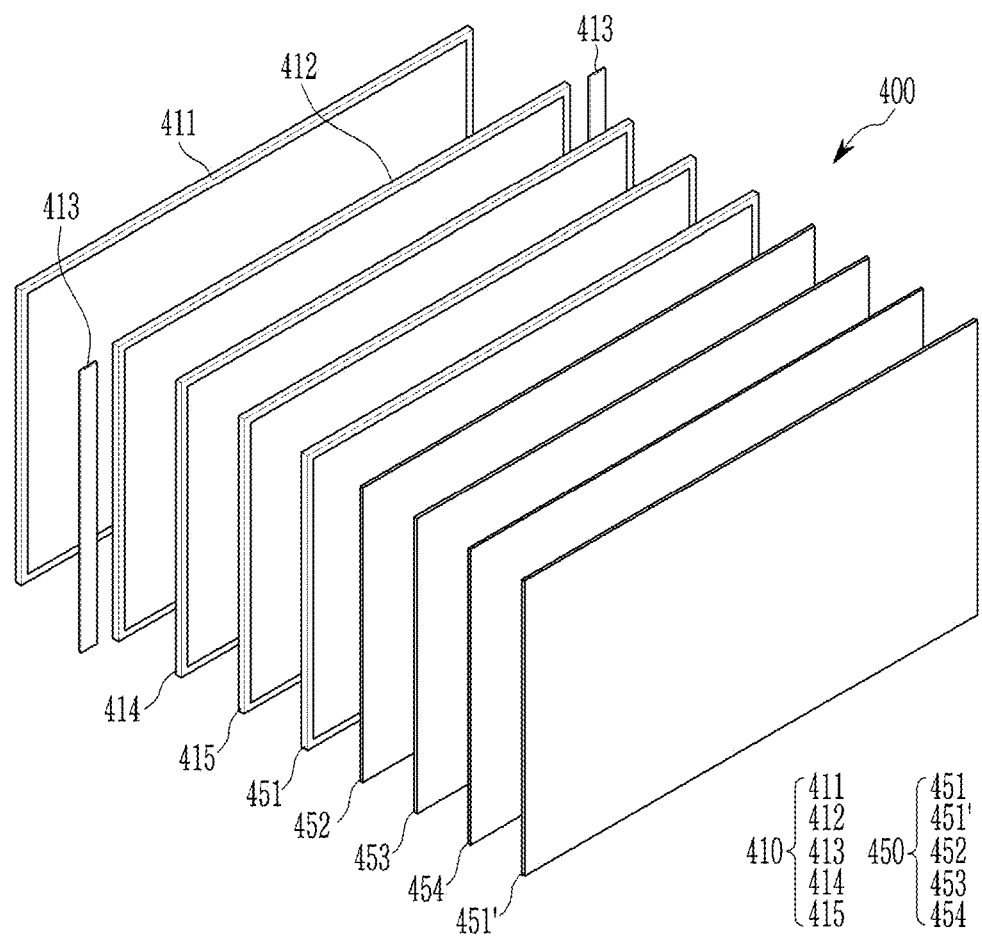
FIG. 5 is a schematic view of a photoluminescent display device according to an embodiment.

Hereinafter, a photoluminescent display device will be described with reference to FIG. 5. FIG. 5 is a schematic view of a photoluminescent display device according to an embodiment. Referring to FIG. 5, a photoluminescent display device 400 may include a backlight unit 410 and a liquid crystal panel 450, and the backlight unit 410 may include a quantum dot-polymer composite sheet (QD sheet) 414. For example, the backlight unit 410 may have a structure in which a reflector 411, a light guide plate (LGP) 412, a light source 413 (a blue LED, etc.), a quantum dot-polymer composite sheet (QD sheet) 414, an optical film 415, and a prism/double brightness enhance film (DBEF, etc., not shown) are stacked. The liquid crystal panel 450 may be disposed on the backlight unit 410 and may have a structure including a thin film transistor (TFT) 452, a liquid crystal 453, and a color filter 454 between two polarizers 451 and 451'. The quantum dot-polymer composite sheet (QD sheet) 414 may include quantum dots emitting red light and quantum dots emitting green light by absorbing light from the light source 413. The blue light provided from the light source 413 may be converted into white light by being combined with the red light and green light emitted from the quantum dots while passing through the quantum dot-polymer composite sheet. The white light may be separated to blue light, green light, and red light by a color filter in the liquid crystal panel and may be emitted to the outside in each pixel.

Figure 6A:
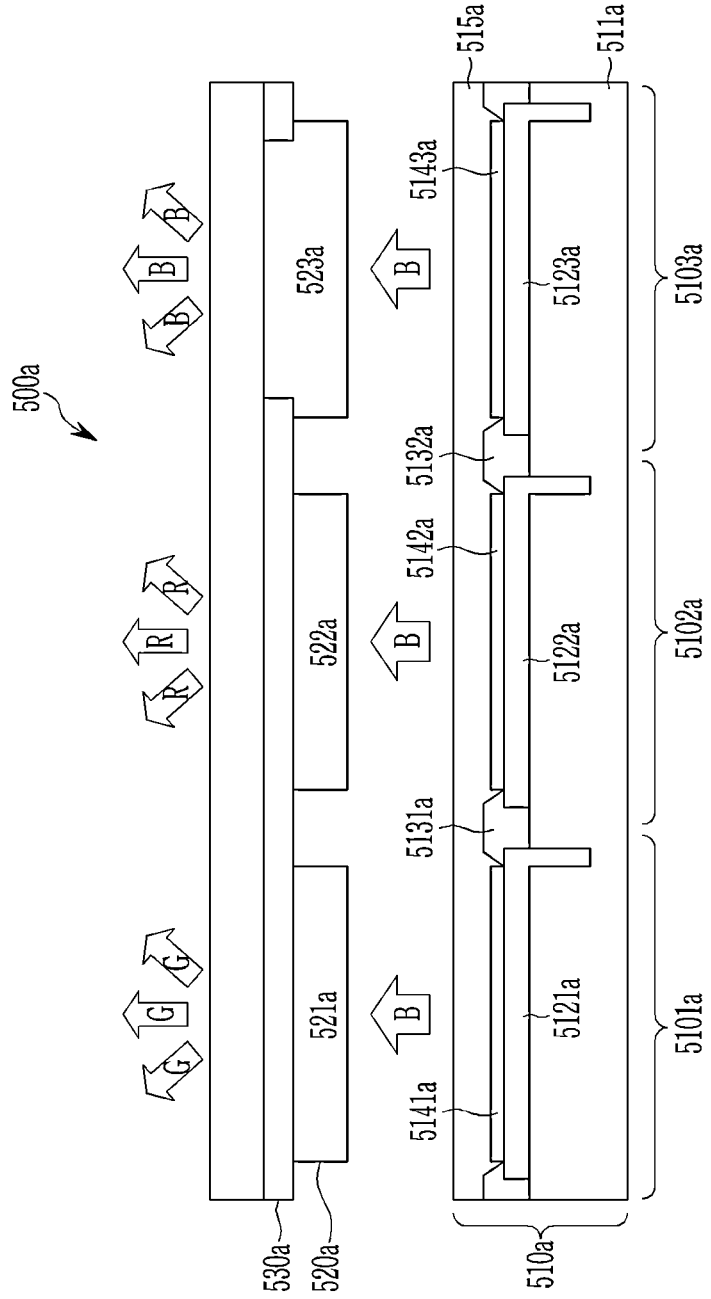
FIG. 6A is a schematic view of a photoluminescent display device according to an embodiment.
Figure 6B:
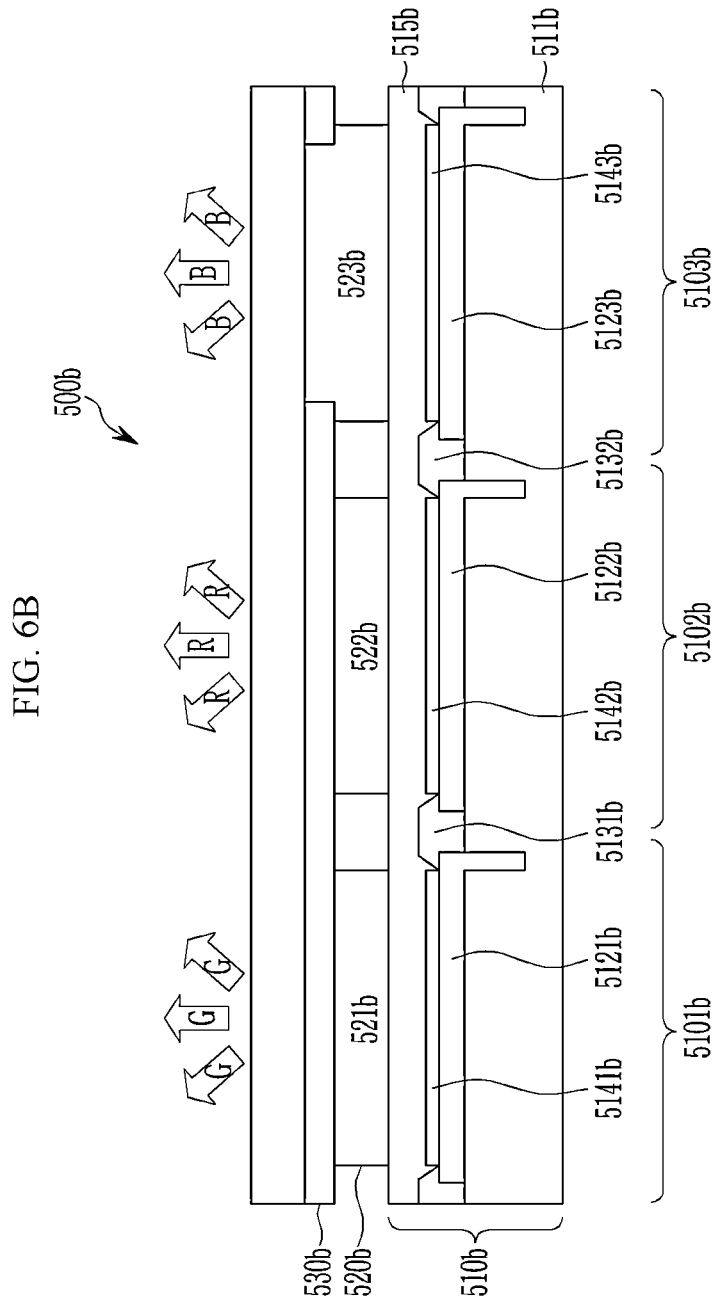
FIG. 6B is a schematic view of a photoluminescent display device according to an embodiment.

Another example of the photoluminescent display device may be a form of a quantum dot laminate structure in which the light emitting element is disposed on a substrate. The quantum dot laminate structure is as described herein, and may have a quantum dot-polymer composite pattern. For example, referring to FIGS. 6A and 6B, the photoluminescent display devices 500a and 500b may be disposed at positions where the quantum dot-polymer composite patterns 520a and 520b face the light sources 510a and 510b. The quantum dot-polymer composite pattern may include first sections 521a and 521b including green quantum dots and second sections 522a and 522b including red quantum dots and optionally, further include third sections 523a and 523b including no quantum dots. The quantum dot-polymer composite pattern may be in contact with a light source (FIG. 6B) or disposed at a regular intervals (FIG. 6A). The light source may include a plurality of light emitting units 5101a, 5102a, 5103a, 5101b, 5102b, and 5103b, and at least one light emitting units 5101a, 5102a, 5101b, and 5102b may be disposed to respectively correspond to each first and second section. If desired, at least one of light emitting units 5103a and 5103b may be further disposed to correspond to a third section.

The light sources 510a and 510b may emit light at a predetermined wavelength (e.g., blue light, green light, or a combination thereof). For example, the light source may emit light having an emission peak wavelength within a range of greater than or equal to about 400 nm, greater than or equal to about 420 nm, or greater than or equal to about 430 nm and less than or equal to about 500 nm, less than or equal to about 490 nm, or less than or equal to about 480 nm.

The light sources 510a and 510b may be electroluminescent devices. For example, the light sources may include a first electrode and a second electrode facing each other and an electroluminescent layer disposed between the first electrode and the second electrode. For example, the light sources 510a and 510b may be organic light emitting diodes (OLED) including an organic light emitting material in an electroluminescent layer. The organic light emitting diode (OLED) may include at least two pixel electrodes 5121a, 5122a, 5123a, 5121b, 5122b, and 5123b formed on a substrate, pixel definition layers 5131a, 5132a, 5131b, and 5132b formed between at least two adjacent pixel electrodes, organic light emitting layers 5141a, 5142a, 5143a, 5141b, 5142b, and 5143b formed on each pixel electrode, and common electrode layers 515a and 515b formed on the organic light emitting layers. Under the organic light emitting diode (OLED), a thin film transistor (not shown) and substrates 511*a* and 511*b* may be disposed.

Light (e.g., blue light) emitted from the light sources enters the first sections and the second sections of the quantum dot-polymer composite pattern and thus may be respectively converted into green light and red light. In addition, the blue light emitted from the light source may pass the third section including no quantum dot-polymer composite pattern. The green light, red light, and blue light may be emitted to the outside for each pixel. For example, the first section emitting the green light may be a green pixel area, the second section emitting the red light may be a red pixel area, and the third section emitting the blue light may be a blue pixel area.

The photoluminescent display device may include optical filter layers 530*a* and 530*b* in addition to the quantum dot-polymer composite pattern. The optical filter layer may block light in a portion of the visible light region and transmit light in the remaining wavelength region. For example, the optical filter layers 530*a* and 530*b* may block blue light, which is in a wavelength region emitted from the light source but transmit light excluding the blue light (e.g., green light, red light, and/or yellow light which is a mixed color thereof). For example, the optical filter layers 530*a* and 530*b* may block greater than or equal to about 80%, greater than or equal to about 90%, or even greater than or equal to about 95% of light of greater than or equal to about 400 nm and less than about 480 nm but have greater than or equal to about 70%, greater than or equal to about 80%, greater than or equal to about 90%, or even about 100% of light transmittance for the remaining light of greater than about 500 nm to less than or equal to 700 nm. These optical filter layers may improve color purity of a display device or increase the photoconversion efficiency of the quantum dot composite pattern.

The optical filter layers 530*a* and 530*b* may be disposed on the first sections 521*a* and 521*b* emitting green light and the second sections 522*a* and 522*b* emitting red light. The optical filter layers may not be disposed on portions corresponding to the third sections (blue pixel areas) 523*a* and 513*b* having no quantum dot-polymer composite pattern. For example, the optical filter layers 530*a* and 530*b* may be formed as one structure on the remaining portions of the quantum dot-polymer composite pattern except for the portions overlapped with the third sections. The optical filter layers 530*a* and 530*b* may be disposed apart each other where overlapped with the first sections and the second sections of the quantum dot-polymer composite pattern. For example, the optical filter layers have first regions and second regions respectively corresponding to the first sections and the second sections of the quantum dot-polymer composite pattern, and these first regions and the second regions may be optically isolated by a black matrix and the like. The first regions of the optical filter layer may be disposed to correspond to the first sections emitting green light (green pixel areas), block blue light and red light, and selectively transmit light within a predetermined wavelength range (e.g., greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm). In addition, the second regions of the optical filter layer may be disposed to correspond to the second sections emitting red light (red pixel areas), block blue light and green light, and selectively transmit light within a predeter-mined range (e.g., greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm).

The optical filter layers 530*a* and 530*b* may absorb a desired wavelength and thus block light of the corresponding wavelength. The optical filter layers 530*a* and 530*b* may include a dye absorbing light of a wavelength to be blocked, a pigment absorbing light of a wavelength to be blocked, or a combination thereof, and this dye, pigment, or combination thereof may be disposed in the polymer matrix.

In addition, the optical filter layers 530*a* and 530*b* may reflect a desired wavelength and thus block light of the corresponding wavelength. The optical filter layers 530*a* and 530*b* may include a plurality of layers (e.g., inorganic material layers) having a different refractive index. For example, the optical filter layers may be disposed in a form of alternately stacking two layers having different refractive indices (e.g., a layer having a high refractive index and a layer having a low refractive index).

The photoluminescent display devices 500*a* and 500*b* may include an additional optical filter layer (not shown) further disposed between the light source and the light emitting element. The additional optical filter layer may reflect light (e.g., green light, red light, or green light and red light) emitted from the quantum dot-polymer composite pattern but transmit light (e.g., blue light) emitted from the light source. For example, the optical filter layer may reflect greater than or equal to about 80%, greater than or equal to about 90%, or even greater than or equal to about 95% of the remaining light of greater than about 500 nm to less than or equal to about 700 nm but have light transmittance of greater than or equal to about 70%, greater than or equal to about 80%, greater than or equal to about 90%, or even about 100% for light of greater than or equal to about 400 nm and less than about 480 nm. This additional optical filter layer may recycle, e.g., reflect, red light, green light, and/or yellow light and increase photoconversion efficiency of the quantum dot composite pattern.

The photoluminescent display devices 500*a* and 500*b* may be manufactured by separately manufacturing a quantum dot laminate structure (the quantum dot-polymer composite pattern) and the light source or directly forming the quantum dot polymer composite pattern on the light source.

Specific examples are presented below. However, the examples described below are only for specifically illustrating or explaining the embodiments and the scope of the invention is not limited thereto.

The bandgap energy (Eg), lattice parameter, and electron/hole effective mass of the semiconductor compounds prepared in examples are shown in Table 1.

TABLE 1

|  | Bandgap energy (eV) | Lattice parameter (nm) | Effective mass | |
|---|---|---|---|---|
|  |  |  | Electron effective mass ($m_e$) | Hole effective mass ($m_e$) |
| ZnSe | 2.82 | 0.567 | 0.17 | 0.75 |
| ZnTe | 2.26 | 0.61 | 0.16 | 0.36 |

TABLE 1-continued

| | Bandgap energy (eV) | Lattice parameter (nm) | Effective mass | |
| --- | --- | --- | --- | --- |
| | | | Electron effective mass ($m_e$) | Hole effective mass ($m_e$) |
| ZnS(cubic) | 3.68 | 0.541 | 0.39 | 1.76 |
| $Ga_2S_3$(cubic) | 3.43 | 0.52 | 0.19 | 0.8 |

*$m_e$: mass of free electron ($9.1*10^{-31}$ kg)

EXAMPLES

Analysis Methods

1. Ultraviolet-Visible (UV-Vis) Spectroscopic Analysis

An Agilent Cary5000 spectrometer is used to perform an ultraviolet (UV) spectroscopic analysis and obtain a UV-Visible absorption spectrum.

2. Photoluminescence Analysis

A Hitachi F-7000 spectrometer is used to obtain a photoluminescent (PL) spectrum of quantum dots at an excitation wavelength of 458 nanometers (nm).

3. Inductively Coupled Plasma Atomic Emission Spectroscopic (ICP-AES) Analysis

Shimadzu ICPS-8100 is used to perform Inductivity Coupled Plasma Atomic Emission Spectroscopy (ICP-AES).

4. X-Ray Photoelectron Spectroscopic (XPS) Analysis

An XPS elemental analysis is performed by using Quantum 2000 made by Physical Electronics, Inc. under conditions of an acceleration voltage of 0.5 kiloelectronvolts (keV) to 15 keV, 300 watts (W), and a minimum analysis area of 200×200 square micrometers ($\mu m^2$).

5. Transmission Electron Microscope Analysis

An UT F30 Tecnai electron microscope is used to obtain a transmission electron microscope photograph of the prepared nanocrystals.

Preparation Example 1-1: Synthesis of InP Core 0.6 millimoles (mmol) of indium acetate, 1.8 mmol of palmitic acid, and 10 milliliters (mL) of 1-octadecene are put in a reactor and heated at 120° C. under vacuum. One hour later, an atmosphere in the reactor is converted into nitrogen. After heating the reactor at 280° C., 0.3 mmol of a tris (trimethylsilyl)phosphine (TMS3P) solution was rapidly injected thereinto and then, reacted for 10 minutes together. Subsequently, acetone is added to the reaction solution rapidly cooled down to room temperature (24° C.) and then, centrifuged to obtain precipitates, and the precipitates are dispersed in toluene.

Preparation Example 1-2: Synthesis of InZnP Core 0.12 mmol of indium acetate, 0.36 mmol of zinc acetate, and 1.08 mmol of palmitic acid are dissolved in an 1-octadecene solvent in a 200 mL reactor and then, heated at 120° C. under vacuum. One hour later, an atmosphere in the reactor is converted into nitrogen. After heating the reactor at 280° C., a mixed solution of 0.15 mmol of tris(trimethylsilyl)phosphine (TMS3P) and 1 mL of trioctylphosphine is rapidly injected thereto and then, reacted for 20 minutes. Subsequently, acetone is added to the reaction solution rapidly cooled down to room temperature and then, centrifuged, and precipitates obtained therefrom are dispersed in toluene.

Example 1: Synthesis of InP/$Ga_2S_3$/ZnS Quantum Dot

Triethyl gallium with an organic ligand including oleic acid is put in a 300 mL reaction flask containing octadecene (ODE) and then, vacuum-treated at 120° C. The flask is internally substituted with nitrogen ($N_2$). While the temperature of the reactor is increased up to the reaction temperature (260° C.), the core of Preparation Example 1-1 is rapidly put in the reaction flask, and subsequently, S/TOP is injected thereinto and then, reacted for 10 minutes. Herein, the triethyl gallium and S/TOP are used in a mole ratio so that a stoichiometric ratio of Ga:S satisfies 1:1.5.

When the reaction is completed, ethanol is added to the reaction solution rapidly cooled down to room temperature and then, centrifuged, and precipitates obtained therefrom are dispersed in toluene to obtain InP/$Ga_2S_3$ (core/first shell) nano particles.

In a 200 mL reaction flask, 1.2 mmol of zinc acetate and 2.4 mmol of oleic acid are dissolved in a trioctylamine solvent and then, vacuum-treated at 120° C. for 10 minutes. The flask is internally substituted with nitrogen ($N_2$) and then, heated up to 280° C. Subsequently, the InP/$Ga_2S_3$ (core/first shell) nano particles are rapidly added thereto, and 0.01 mmol of S/TOP is added thereto and then, heated up to 320° C. to perform a second shell-forming reaction for 60 minutes.

Subsequently, acetone is added to the reaction solution rapidly cooled down to room temperature and then, centrifuged, and precipitates obtained therefrom are dispersed in toluene to prepare InP/$Ga_2S_3$/ZnS quantum dot dispersion.

Example 2: Synthesis of InZnP/$Ga_2S_3$/ZnS Quantum Dot

InZnP/$Ga_2S_3$/ZnS quantum dot dispersion is prepared according to the same method as Example 1 except that the core of Preparation Example 1-2 is used instead of the core of Preparation Example 1-1.

Example 3: Synthesis of InZnP/$Ga_2S_3$/ZnSe/ZnS Quantum Dot

Triethyl gallium with an organic ligand including oleic acid is put in a 300 mL reaction flask containing octadecene (ODE) and then, vacuum-treated at 120° C. The flask is internally substituted with nitrogen ($N_2$). While the temperature of the reactor is increased up to the reaction temperature (260° C.), the core of Preparation Example 1-2 is rapidly put in the reaction flask, and subsequently, S/TOP is injected thereinto and then, reacted for 10 minutes. Herein, the triethyl gallium and S/TOP are used in a mole ratio so that a stoichiometric ratio of Ga:S satisfies 1:1.5.

When the reaction is completed, ethanol is added to the reaction solution rapidly cooled down to room temperature and then, centrifuged, and precipitates obtained therefrom are dispersed in toluene to obtain InZnP/$Ga_2S_3$ (core/first shell) nano particles.

In a 200 mL reaction flask, 1.2 mmol of zinc acetate and 2.4 mmol of oleic acid are dissolved in a trioctylamine solvent and then, vacuum-treated at 120° C. for 10 minutes. The flask is internally substituted with nitrogen ($N_2$) and then, heated up to 280° C. Then, the InZnP/$Ga_2S_3$ (core/first shell) nano particles are rapidly added thereto, and subsequently, 0.3 mmol of Se/TOP is added thereto and then, heated up to 320° C. and reacted for 60 minutes to perform a ZnSe shell-forming reaction and obtain InZnP/Ga$_2$S$_3$/ZnSe nano particles.

In a 200 mL reaction flask, 1.2 mmol of zinc acetate and 2.4 mmol of oleic acid are dissolved in a trioctylamine solvent and then, vacuum-treated at 120° C. for 10 minutes. The flask is internally substituted with nitrogen (N$_2$) and then, heated up to 280° C. Then, the InZnP/Ga$_2$S$_3$/ZnSe nano particles are rapidly added thereto, and subsequently, 1.2 mmol of S/TOP is added thereto and then, heated up to 320° C. and reacted for 60 minutes to perform a ZnS shell-forming reaction and obtain InZnP/Ga$_2$S$_3$/ZnSe/ZnS quantum dots.

Comparative Example 1: Synthesis of InZnP/ZnS Quantum Dot

In a 200 mL reaction flask, 1.2 mmol of zinc acetate and 2.4 mmol of oleic acid are dissolved in a trioctylamine solvent and then, vacuum-treated at 120° C. for 10 minutes. The flask is internally substituted with nitrogen (N$_2$) and then, heated up to 280° C. Subsequently, the InZnP core of Preparation Example 1-2 is rapidly added thereto, and subsequently, 1.2 mmol of S/TOP is added thereto and then, heated up to 320° C. to perform a shell-forming reaction for 60 minutes.

Subsequently, acetone is added to the reaction solution rapidly cooled down to room temperature and then, centrifuged, and precipitates obtained therefrom are dispersed in toluene to prepare InZnP/ZnS quantum dot dispersion.

Comparative Example 2: Synthesis of InZnP/Ga$_2$S$_3$ Quantum Dot

Triethyl gallium with an organic ligand including oleic acid is put in a 300 mL reaction flask containing octadecene (ODE) and then, vacuum-treated at 120° C. The flask is internally substituted with nitrogen (N$_2$). While the temperature of the reactor is increased up to the reaction temperature (260° C.), the InZnP core of Preparation Example 1-2 is rapidly put in the reaction flask and then, reacted for 10 minutes. Herein, the triethyl gallium and S/TOP are used in a mole ratio so that a stoichiometric ratio of Ga:S satisfies 1:1.5.

When the reaction is completed, ethanol is added to the reaction solution rapidly cooled down to room temperature and then, centrifuged, and precipitates obtained therefrom are dispersed in toluene to prepare InZnP/Ga$_2$S$_3$ quantum dot dispersion.

Composition Analysis of Quantum Dots

Figure 7:
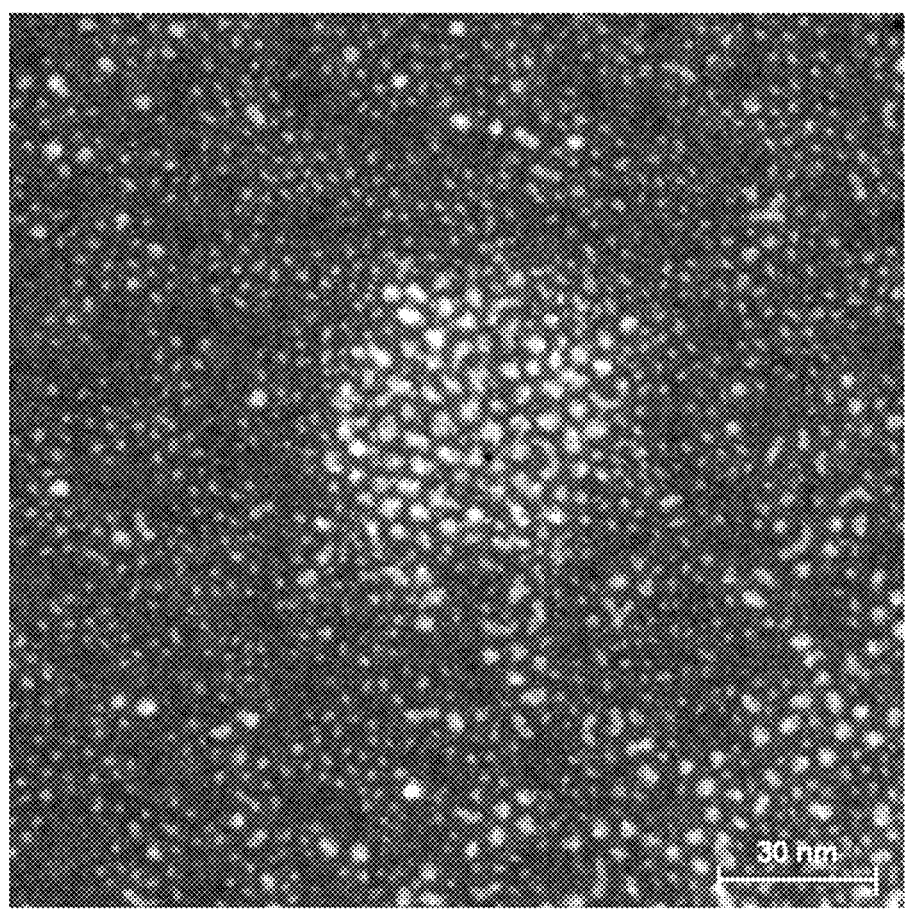
FIG. 7 shows a transmission electron microscopic (TEM) image of the quantum dots prepared in Example 2.

With respect to the quantum dots prepared in Examples 1 to 3 and Comparative Examples 1 and 2, a transmission electron microscope-analysis is performed. Among them, a transmission electron microscope (TEM) image of the quantum dots prepared in Example 2 is shown in FIG. 7. FIG. 7 shows the transmission electron microscope (TEM) image of the quantum dots prepared in Example 2. Referring to FIG. 7, the InZnP/Ga$_2$S$_3$/ZnS quantum dots have a non-spherical particle shape (a particle size: about 4 nm).

Inductively-coupled plasma atomic emission spectroscopy is performed with respect to the quantum dots prepared in Examples 1 to 3 and Comparative Examples 1 and 2, and the results of Example 2 are shown in Table 2.

TABLE 2

| | Mole ratio | | | |
|---|---|---|---|---|
| | (In + Ga):P | (In + Ga):Zn | (In + Ga):S | Ga:In |
| Example 2 | 2.77:1 | 0.46:1 | 0.68:1 | 0.94:1 |

Referring to Table 2, the quantum dots prepared in Example 2 satisfy claimed mole ratio ranges.

Figure 8:
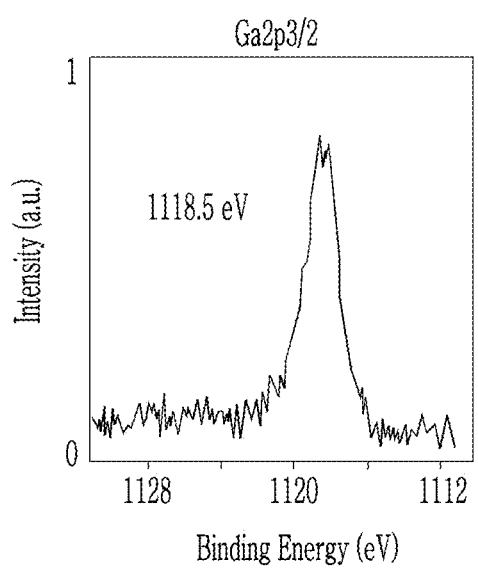
FIG. 8 is a graph of intensity (arbitrary units (a.u.)) versus binding energy (electronvolts (eV)) showing the results of X-ray photoelectron spectroscopy (XPS) analysis of the quantum dots prepared in Example 2.

The quantum dots prepared in Examples 1 to 3 and Comparative Examples 1 and 2 are XPS-analyzed to examine the compositions. The analysis result of Example 2 is shown in FIG. 8. FIG. 8 is a graph showing the X-ray photoelectron spectroscopy (XPS) analysis result of the quantum dots prepared in Example 2. Referring to FIG. 8, the quantum dots exhibit a peak at 1118.5 eV, and this peak corresponds to a peak of Ga$_2$S$_3$. On the other hand, FIG. 8 showing no peak at 1117.9 eV confirms that gallium oxide (Ga$_2$O$_3$) is not present. Accordingly, the quantum dots prepared in Example 2 include Ga$_2$S$_3$ having excellent stability. The result of FIG. 8 shows that a first shell thereof includes Ga$_2$S$_3$.

Photoluminescent (PL) and UV-Vis Spectroscopic Analysis of Quantum Dot

Figure 9:
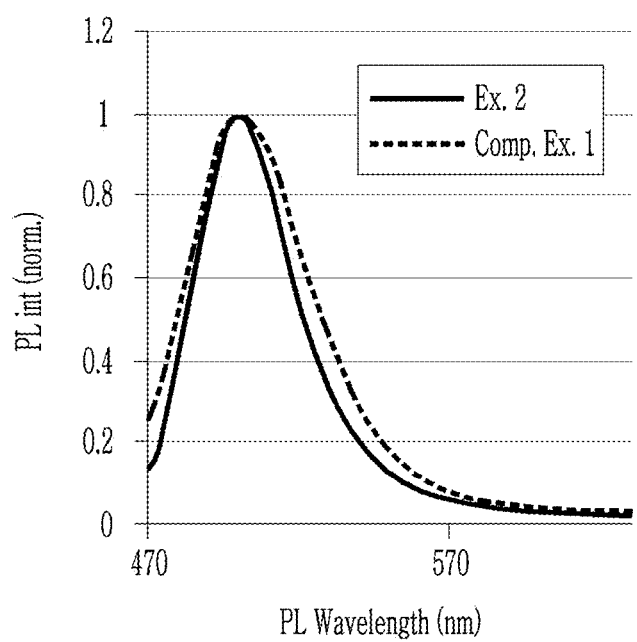
FIG. 9 is a graph of photoluminescent intensity (PL int) (normalized (norm.)) versus photoluminescent wavelength (nm) showing photoluminescence analysis results of the quantum dots prepared in Example 2 and Comparative Example 1.
Figure 10:
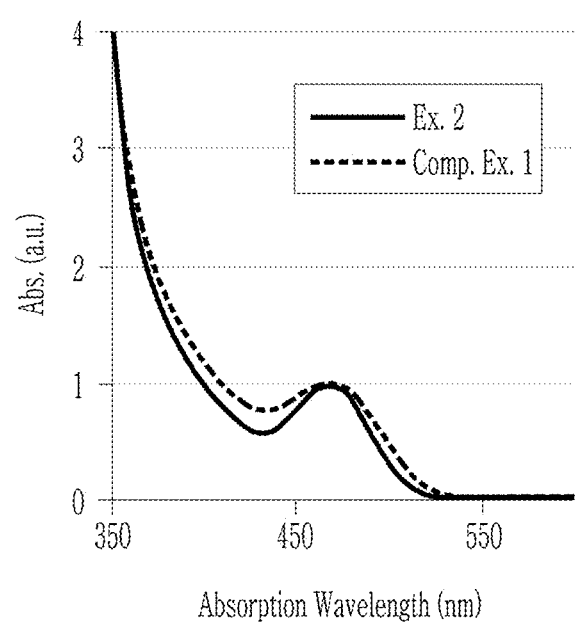
FIG. 10 is a graph of absorption (Abs.) (a.u.) versus absorption wavelength (nm) showing the results of ultraviolet-visible (UV-Vis) spectroscopic analysis of the quantum dots prepared in Example 2 and Comparative Example 1.

A photoluminescent characteristic analysis and a UV-Vis spectroscopic analysis are performed with respect to the quantum dots prepared in Examples 1 to 3 and Comparative Examples 1 and 2, and the results are shown in Table 3. The photoluminescence analysis result and the UV-Vis spectroscopic analysis result of the quantum dots prepared in Example 2 and Comparative Example 1 are shown in FIG. 9 and FIG. 10. FIG. 9 is a graph showing the photoluminescence analysis results of the quantum dots prepared in Example 2 and Comparative Example 1, and FIG. 10 is a graph showing the UV-Vis spectroscopic analysis results of the quantum dots prepared in Example 2 and Comparative Example 1.

TABLE 3

| | PL Peak Wavelength (458 excitation wavelength (ex)) (nm) | UV Absorption Peak Wavelength (nm) | Full Width at Half Maximum (FWHM) (458 ex (nm) | Photoluminescent Quantum Yield (PLQY) (%) |
|---|---|---|---|---|
| Example 2 | 493 | 460 | 39 | 55 |
| Example 3 | 535 | 510 | 35 | 92 |
| Comparative Example 1 | 500 | 475 | 48 | 42 |
| Comparative Example 2 | 507 | 466 | 42 | 11 |

Referring to Table 3 and FIGS. 9 and 10, the quantum dots prepared in Example 2 exhibit a maximum light emitting peak at 493 nm, which belongs to a blue light region, and a light absorption at 460 nm, and the quantum dots prepared in Example 3 exhibit a maximum light emitting peak at 535 nm, which belongs to a green light region, and a light absorption at 510 nm. In addition, the quantum dots of Examples 2 and 3 exhibit a greatly reduced full width at half maximum (FWHM) of a maximum light emitting peak and increased quantum efficiency compared with the quantum dots of Comparative Examples 1 and 2. Accordingly, the quantum dots of Examples 2 and 3 exhibit excellent light absorption.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
a core comprising a first semiconductor nanocrystal comprising a Group III-V compound;
a first shell comprising a second semiconductor nanocrystal comprising a Group III-VI compound disposed on the core; and
a second shell comprising a plurality of layers on the first shell;
wherein the plurality of layers comprises a third semiconductor nanocrystal comprising a first Group II-VI compound and a fourth semiconductor nanocrystal comprising a second Group II-VI compound, wherein the first Group II-VI compound is different from the second Group II-VI compound.

2. The quantum dot of claim 1, wherein
a ratio of an effective mass of the second semiconductor nanocrystal relative to an effective mass of the third semiconductor nanocrystal is greater than or equal to about 0.4:1 to about 2.5:1.

3. The quantum dot of claim 1, wherein the second semiconductor nanocrystal has an electron effective mass of less than about 0.39 $m_e$.

4. The quantum dot of claim 1, wherein the second semiconductor nanocrystal has a hole effective mass of less than about 1.76 $m_e$.

5. The quantum dot of claim 1, wherein
a difference between an electron effective mass of the second semiconductor nanocrystal and an electron effective mass of the third semiconductor nanocrystal is less than or equal to about 0.2 $m_e$.

6. The quantum dot of claim 1, wherein
a difference between a hole effective mass of the second semiconductor nanocrystal and a hole effective mass of the third semiconductor nanocrystal is less than or equal to about 1.5 $m_e$.

7. The quantum dot of claim 1, wherein the Group III-V compound further comprises a Group II element.

8. The quantum dot of claim 1, wherein the Group III-V compound comprises InP, GaP, InAs, GaAs, InSb, GaSb, InGaP, InAsP, InSbP, InGaAs, InZnP, GaZnP, InZnAs, or a combination thereof.

9. The quantum dot of claim 1, wherein the second semiconductor nanocrystal comprises gallium.

10. The quantum dot of claim 1, wherein the second semiconductor nanocrystal comprises a gallium chalcogenide.

11. The quantum dot of claim 1, wherein the second semiconductor nanocrystal comprises a compound represented by
$(M^1)_2(X^1)_3$, wherein $M^1$ is In, Ga, or a combination thereof, and $X^1$ is S, Se, Te, or a combination thereof, a compound represented by Chemical Formula 1, or a combination thereof:

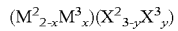  Chemical Formula 1 wherein, in Chemical Formula 1,
$M^2$ and $M^3$ are each independently In, Ga, or a combination thereof, $X^2$ and $X^3$ are each independently S, Se, Te, or a combination thereof, x is 0 to 2, and y is 0 to 3.

12. The quantum dot of claim 1, wherein the first Group II-VI compound, the second Group II-VI compound, or a combination thereof comprises a zinc chalcogenide.

13. The quantum dot of claim 1, wherein the first Group II-VI compound, the second Group II-VI compound, or a combination thereof comprises ZnSe, ZnTeSe, ZnSeS, ZnTeS, ZnS, or a combination thereof.

14. The quantum dot of claim 1, wherein the first Group II-VI compound the second Group II-VI compound, or a combination thereof comprises zinc, sulfur, and selenium or zinc, selenium, and tellurium.

15. The quantum dot of claim 1, wherein
in the quantum dot, a mole ratio of a Group III element of the Group III-V compound and Group III-VI compound to a Group V element is about 1:1 to about 50:1.

16. The quantum dot of claim 1, wherein in the quantum dot, a mole ratio of the Group III element to the Group V element is about 2.5:1 to about 20:1.

17. The quantum dot of claim 1, wherein in the quantum dot, a mole ratio of the Group III element to the Group II element is greater than about 0:1 and less than or equal to about 5:1.

18. The quantum dot of claim 1, wherein in the quantum dot, a mole ratio of the Group III element to the Group II element is about 0.05:1 to about 2:1.

19. The quantum dot of claim 1, wherein in the quantum dot, a mole ratio of the Group III element to the Group VI element is greater than about 0:1 and less than or equal to about 5:1.

20. The quantum dot of claim 1, wherein in the quantum dot, a mole ratio of the Group III element to the Group VI element is about 0.05:1 to about 2:1.

21. The quantum dot of claim 1, wherein in the quantum dot, the first semiconductor nanocrystal comprises indium, the second semiconductor nanocrystal comprises gallium, and a mole ratio of gallium to indium is about 0.05:1 to about 4.5:1.

22. The quantum dot of claim 1, wherein the second shell further comprises a Group III-V compound.

23. The quantum dot of claim 22, wherein a layer closest to the core among the plurality of layers comprises Se.

24. The quantum dot of claim 22, wherein a layer disposed farthest from the core among the plurality of layers comprises S.

25. The quantum dot of claim 1, wherein a bandgap energy of the second semiconductor nanocrystal is greater than a bandgap energy of the first semiconductor nanocrystal, and
the bandgap energy of the second semiconductor nanocrystal is greater than a bandgap energy of the third semiconductor nanocrystal.

26. The quantum dot of claim 25, wherein the third semiconductor nanocrystal comprising the first Group II-VI compound is present in a layer closest to the first shell among the plurality of layers and has a smaller bandgap energy than the second semiconductor nanocrystal of the first shell.

27. The quantum dot of claim 1, wherein a lattice mismatch of the first semiconductor nanocrystal and the second semiconductor nanocrystal is less than or equal to about 15%.

28. The quantum dot of claim 1, wherein a maximum emission peak of the quantum dots has a full width at half maximum of less than or equal to about 40 nanometers.

29. The quantum dot of claim 1, wherein the quantum dot has a quantum efficiency of greater than or equal to about 55%.

30. The quantum dot of claim 1, wherein
the first semiconductor nanocrystal comprises indium and phosphorus;
the second semiconductor nanocrystal comprises gallium and sulfur; and
the third semiconductor nanocrystal comprises zinc and sulfur; zinc and selenium; or a combination thereof.

31. A quantum dot-polymer composite, comprising
a polymer matrix; and
a plurality of quantum dots dispersed in the polymer matrix,
wherein the plurality of quantum dots comprise a quantum dot comprising
  a core comprising a first semiconductor nanocrystal comprising a Group III-V compound;
  a first shell comprising a second semiconductor nanocrystal comprising a Group III-VI compound disposed on the core; and
  a second shell comprising a plurality of layers on the first shell;
  wherein the plurality of layers comprises a third semiconductor nanocrystal comprising a first Group II-VI compound and a fourth semiconductor nanocrystal comprising a second Group II-VI compound, wherein the first Group II-VI compound is different from the second Group II-VI compound.

32. The quantum dot-polymer composite of claim 31, wherein the polymer matrix comprises a thiolene polymer, a (meth)acrylate polymer, a urethane polymer, an epoxy polymer, a vinyl polymer, a silicone, or a combination thereof.

33. The quantum dot-polymer composite of claim 31, wherein the composite further comprises metal oxide particulates.

34. An electronic device, comprising
a first electrode;
a second electrode facing each other; and
an active layer located between the first electrode and the second electrode;
wherein the active layer comprises a quantum dot comprising
  a core comprising a first semiconductor nanocrystal comprising a Group III-V compound;
  a first shell comprising a second semiconductor nanocrystal comprising a Group III-VI compound disposed on the core; and
  a second shell comprising a plurality of layers on the first shell;
  wherein the plurality of layers comprises a third semiconductor nanocrystal comprising a first Group II-VI compound and a fourth semiconductor nanocrystal comprising a second Group II-VI compound, wherein the first Group II-VI compound is different from the second Group II-VI compound.

35. The electronic device of claim 34, further comprising a hole auxiliary layer.

36. The electronic device of claim 34, further comprising an electron auxiliary layer.

37. An electronic device comprising
a light source, and
a light emitting element,
wherein the light emitting element comprises the quantum dot of claim 1, and
the light source is configured to provide incident light to the light emitting element.

38. The electronic device of claim 37, wherein the incident light has a photoluminescence peak wavelength of about 400 nanometers to about 500 nanometers.

39. The electronic device of claim 37, wherein the light emitting element comprises a quantum dot-polymer composite.

40. An electronic device comprising the quantum dot of claim 1.

* * * * *